(12) United States Patent
Farrow et al.

(10) Patent No.: US 8,546,027 B2
(45) Date of Patent: Oct. 1, 2013

(54) SYSTEM AND METHOD FOR DIRECTED SELF-ASSEMBLY TECHNIQUE FOR THE CREATION OF CARBON NANOTUBE SENSORS AND BIO-FUEL CELLS ON SINGLE PLANE

(75) Inventors: Reginald C. Farrow, Somerset, NJ (US); Zafar Iqbal, Morristown, NJ (US); Alokik Kanwal, Princeton, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 695 days.

(21) Appl. No.: 12/722,622

(22) Filed: Mar. 12, 2010

(65) Prior Publication Data
US 2010/0279179 A1 Nov. 4, 2010

Related U.S. Application Data

(63) Continuation-in-part of application No. 11/765,788, filed on Jun. 20, 2007, now Pat. No. 7,736,979, and a continuation-in-part of application No. 11/765,735, filed on Jun. 20, 2007, now Pat. No. 7,964,143.

(60) Provisional application No. 61/160,065, filed on Mar. 13, 2009, provisional application No. 61/237,339, filed on Aug. 27, 2009.

(51) Int. Cl.
*H01M 8/16* (2006.01)
(52) U.S. Cl.
USPC .......................................................... 429/401
(58) Field of Classification Search
None
See application file for complete search history.

(56) References Cited

U.S. PATENT DOCUMENTS

| | | |
|---|---|---|
| 6,515,325 B1 | 2/2003 | Farnworth et al. |
| 6,566,704 B2 | 5/2003 | Choi et al. |
| 6,616,497 B1 | 9/2003 | Choi et al. |

(Continued)

FOREIGN PATENT DOCUMENTS

| | | |
|---|---|---|
| JP | 2001312953 | 11/2001 |
| JP | 2006111498 | 4/2006 |
| WO | WO 03/081687 A2 | 10/2003 |

OTHER PUBLICATIONS

Heller, Miniature biofuel cells, Article on the web 19th Dec. 2003, Phys. Chem. Chem. Phys., 2004, 6, 209-216.*

(Continued)

*Primary Examiner* — Patrick Ryan
*Assistant Examiner* — Jose Colucci Rios
(74) *Attorney, Agent, or Firm* — McCarter & English, LLP

(57) ABSTRACT

Improved nanotube devices and systems/methods for fabrication thereof are provided. The present disclosure provides systems/methods for depositing controlled numbers of nanotubes with specific properties at predefined locations for the fabrication of nanotube devices. The nanotube devices may be utilized in a range of applications. A bio-fuel cell system that does not require a proton exchange membrane separator and does not need a mediator to transfer charge is provided. This exemplary bio-fuel cell uses enzyme functionalized SWNTs for the anode/cathode. The absence of a membrane in the bio-fuel cell configuration opens up the possibility of other configurations that would otherwise be unfeasible. This includes a bio-fuel cell where the anode/cathode are on the same substrate. Since the electrodes can share the same substrate, the configuration may be integrated with a circuit device on the same substrate. An IC and its power source may be fabricated on the same silicon wafer.

29 Claims, 18 Drawing Sheets

(56) References Cited

U.S. PATENT DOCUMENTS

| | | | |
|---|---|---|---|
| 6,740,910 B2 | 5/2004 | Roesner et al. | |
| 6,830,981 B2 | 12/2004 | Lee et al. | |
| 6,838,297 B2 | 1/2005 | Iwasaki et al. | |
| 6,858,891 B2 | 2/2005 | Farnworth et al. | |
| 6,933,222 B2 | 8/2005 | Dubin et al. | |
| 6,979,590 B2 | 12/2005 | Rueckes et al. | |
| 6,995,046 B2 | 2/2006 | Rueckes et al. | |
| 7,045,421 B2 | 5/2006 | Rueckes et al. | |
| 7,081,385 B2 | 7/2006 | Farnworth et al. | |
| 7,091,096 B2 | 8/2006 | Balasubramanian et al. | |
| 7,132,714 B2 | 11/2006 | Bae et al. | |
| 7,135,773 B2 | 11/2006 | Furukawa et al. | |
| 7,211,844 B2 | 5/2007 | Furukawa et al. | |
| 7,652,418 B2 | 1/2010 | Choi et al. | |
| 2003/0102222 A1 | 6/2003 | Zhou et al. | |
| 2004/0245209 A1* | 12/2004 | Jung et al. | 216/8 |
| 2005/0095466 A1 | 5/2005 | Minteer et al. | |
| 2005/0106425 A1* | 5/2005 | Damore et al. | 429/12 |
| 2005/0118494 A1* | 6/2005 | Choi | 429/43 |
| 2005/0156203 A1 | 7/2005 | Bae et al. | |
| 2005/0167655 A1 | 8/2005 | Furukawa et al. | |
| 2006/0169972 A1 | 8/2006 | Furukawa et al. | |
| 2006/0233694 A1 | 10/2006 | Sandhu et al. | |
| 2006/0249388 A1 | 11/2006 | Chang et al. | |
| 2006/0286023 A1 | 12/2006 | Huang | |
| 2007/0122986 A1 | 5/2007 | Sandhu et al. | |
| 2007/0287034 A1 | 12/2007 | Minteer et al. | |
| 2008/0044721 A1* | 2/2008 | Heller et al. | 429/43 |
| 2008/0160384 A1 | 7/2008 | Iqbal et al. | |
| 2009/0045061 A1 | 2/2009 | Farrow et al. | |

OTHER PUBLICATIONS

Louh et al., Design of electrophoretically deposited microporous layer/catalysts layer composite structure for power generation of fuel cells, Available online Aug. 19, 2008, International Journal of Hydrigen Energy 33 (2008) 5199-5204.*
WO 2008/035258 A2, Pijnenburg et al., Electrochemical Energy Source and Electronic Device Suitable for Bioimplantation, Mar. 27, 2008.*
Yamamoto et al., Orientation and Purification of Carbon Nanotubes Using AC Electrophoresis, J. Phys. D: Appl. Phys. 31, 1998, pp. L34-L36.
Van der Biest, et al., Electrophoretic Deposition of Materials, Annual Review of Materials Science, 29, pp. 327-352, 1999.
Katz et al., A Non-compartmentalized Glucose | $O_2$ Biofuel Cell by Bioengineering Electrode Surfaces, Journal of Electroanalytical Chemistry, vol. 479, 1999, pp. 64-68.
Choi, et al., Electrophoresis Deposition of Carbon Nanotubes for Triode-Type Field Emission Display, Applied Physics Letters, vol. 78, No. 11, Mar. 12, 2001, pp. 1547-1549.
Choi, Ultrahigh-Density Nanotransistors by Using Selectively Grown Vertical Carbon Nanotubes, Applied Physics Letters, vol. 79, No. 22, Nov. 26, 2001, pp. 3696-3698.
Farinas, et al., Current Opinion in Biotechnology, 12, 551, 2001.
Merkulov et al., Alignment Mechanism of Carbon Nanofibers Produced by Plasma-Enhanced Chemical-Vapor Deposition, Applied Physics Letters, vol. 79, No. 18, Oct. 29, 2001, pp. 2970-2972.
Catrysse at al., RTO Technical Report 59: Electromagnetic Compatibility in the Defense Systems of Future Years, NATO, Jun. 2002, pp. 3-54.
Bae, et al., Field Emission Properties of Carbon Nanotubes Deposited by Electrophoresis, Physica B 323, 2002, pp. 168-170.
Choi, et al., Carbon Nanotube for Nanoelectronics, IEEE-NANO 2003, San Francisco, CA 2003.
Duesberg et al., Growth of Isolated Carbon Nanotubes with Lithographically Defined Diameter and Location, Nano Letters, 2003, vol. 3, No. 2, pp. 257-259.
Hoenlein et al., Carbon Nanotubes for Microelectronics: Status and Future Prospects, Materials Science and Engineering C23, 2003, pp. 663-669.
Kurnosov, et al., Influence of the Interelectrode Distance in Electrophoretic Cold Cathode Fabrication on the Emission Uniformity, Applied Surface Science 251, 2003, pp. 232-236.
Choi et al., Aligned Carbon Nanotubes for Nanoelectronics, Nanotechnology, 15 (10), S512-S516, 2004.
Duesberg, et al. Ways Towards the Scaleable Integration of Carbon Nanotubes into Silicon Based Technology, Diamond and Related Materials, vol. 13, 2004, pp. 354-361.
Graham et al., Towards the Integration of Carbon Nanotubes in Microelectronics, Diamond and Related Materials, vol. 13, 2004, pp. 1296-1300.
Lin et al., Glucose Biosensors Based on Carbon Nanotube Nanoelectrode Ensembles, 4 Nano Lett. 191-195 (2004).
Cai et al., Direct Electron Transfer of Glucose Oxidase Promoted by Carbon Nanotubes, Analytical Biochemistry, vol. 332, 2004, pp. 75-83.
Ma, et al., Electron Field Emission Properties of Carbon Nanotubes-Deposited Flexible Film, Applied Surface Science, 251, 2005, pp. 258,261.
Graham, et al., How Do Carbon Nanotubes Fit Into the Semiconductor Roadmap?, Applied Physics A: Materials Science & Processing, 80 (6); pp. 1141-1151, 2005.
Michalet, et al., Quantum Dots for Live Cells, in Vivo Imaging, and Diagnostics, Science, 307 (5709), pp. 538-544, 2005.
Hahn et al., Fabrication of Clean Carbon Nanotube Field Emitters, Applied Physics Letters, vol. 88, 113101, 2006.
Kim et al., Parallel Patterning of Nanoparticles via Electrodynamic Focusing of Charged Aerosols, Nature Nanotechnology, vol. 1, Nov. 2006, pp. 117-121.
Arnold, et al., Nature Nanotechnology, 1, 60, 2006.
Bing-Yue, et al., *Effect of Oxygen Absorption on Contact Resistance between Metal and Carbon NanoTubes, and Impact of Back Gate Bias on Hot-Carrier Effects of n-channel Tri-Gate FETs*, 2006 International Symposium on VLSI Technology, Systems and Applicatioins, 2006 (Apr. 24-26, 2006) [extended abstract online: http://ieeexplore.ieee.org/stamp/stamp.jsp?arnumber=4016614&isnumber=4016579].
Bullen, et al., Biosensors and Bioelectronics 21, 2015, 2006.
Robertson, Growth of Nanotubes for Electronics, Materials Today, 10 (1-2), pp. 36-43, 2007.
Davis, et al., Biofuel Cells—Recent Advances and Applications, Biosensors and Bioelectronics, BIOS2064, 22 (7), pp. 1-12, 2006.
Lim, et al., Chem. Phys., 9, 1809-1814, 2007.
Makaram et al., Nanotechnology, 18, 395204, 2007.
Ouitrakul, et al., Impedance Analysis of Bio-Fuel Cell Electrodes, Biosensors and Bioelectronics, 23 (5), pp. 721,727, 2007.
Leroy, et al., Journal of Applied Physics 101, 053714, 2007.
Goyal, et al., Directed Self-Assembly of Individual Vertically Aligned Carbon Nanotubes, Journal of Vacuum Science Technology, B 26, pp. 2524-2528, 2008.
Moehlenbrock, et al., Chem. Soc. Rev., 37, pp. 1188-1196, 2008.
Wang, et al., Membrane-Less and Mediator-Free Enzymatic Biofuel Cell Using Carbon Nanotube/Porous Silicon Electrodes, Electrochemistry Communications, 11, 34-37, 2009.
S.C. Wang et al, *Carbon nanotube-based, membrane-less and mediator-free enzymatic biofuel cells*, paper presented at the 215th Electrochemical Society Meeting, San Francisco, CA, May 26, 2009, Abstract #1188.
Manohar, et al., Electrochemica Acta, 54, pp. 1664-1670, 2009.
Notification of Transmittal of the International Search Report and Written Opinion of the International Search Authority for PCT/US2008/067618, mailed Mar. 6, 2009, 9 pages.
Notification of Transmittal of the International Search Report and Written Opinion of the International Search Authority for PCT/US2008/067604, mailed Feb. 10, 2009, 8 pages.
PCT International Search Report and Written Opinion for PCT/US2010/027083, dated Apr. 23, 2010, 8 pages.

* cited by examiner

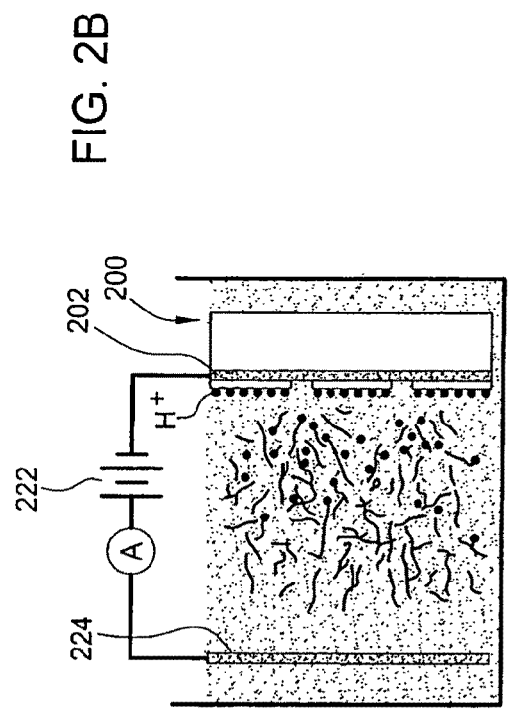
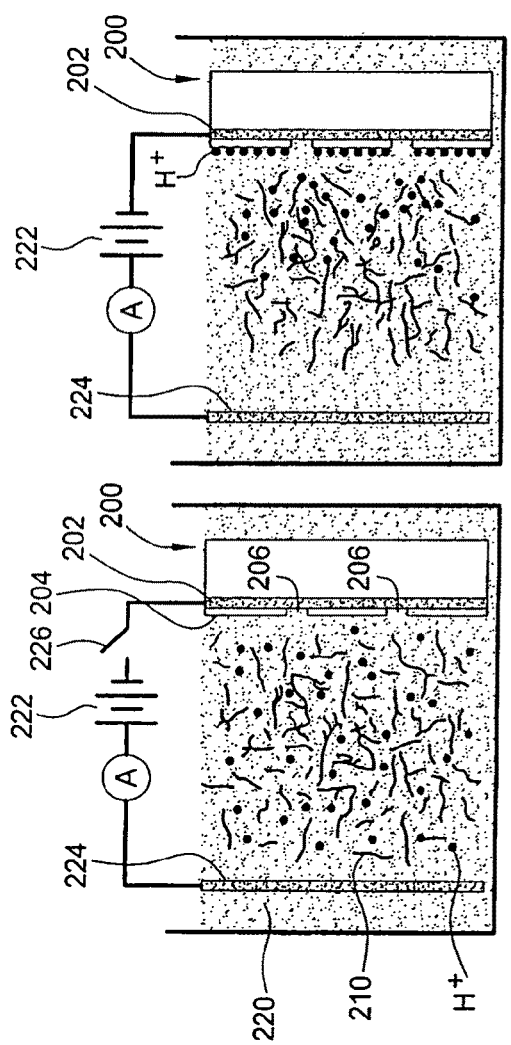
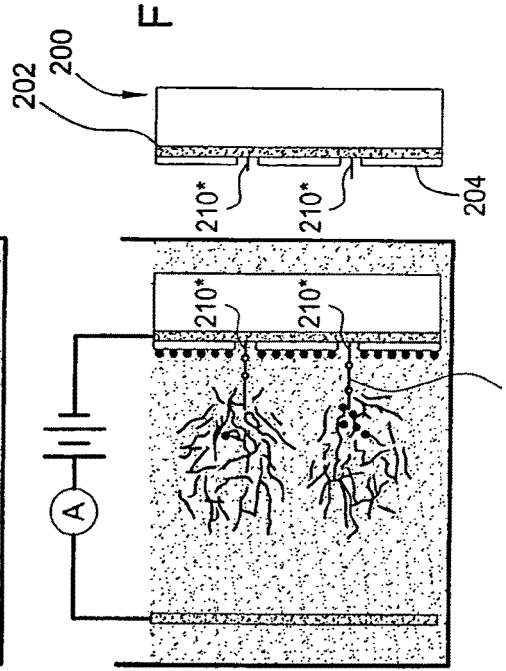
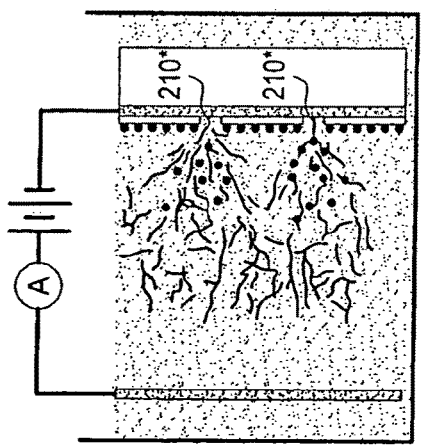
FIG. 2A   FIG. 2B   FIG. 2C   FIG. 2D   FIG. 2E

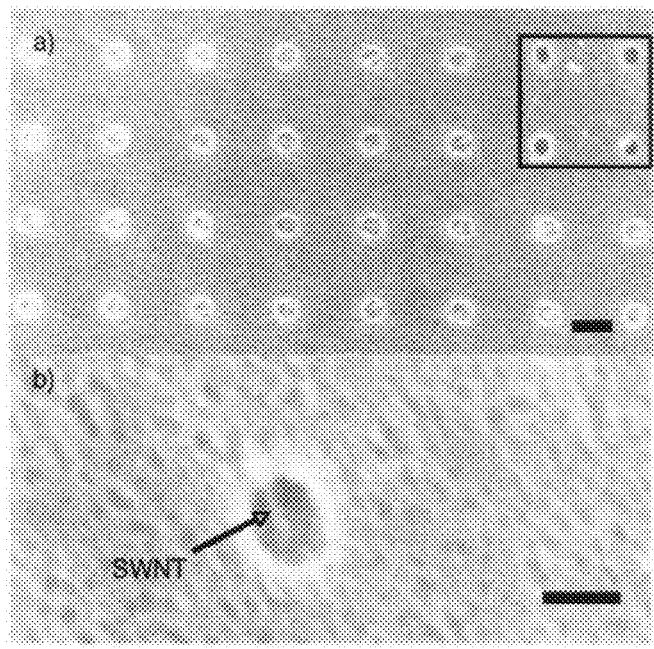

Figures 4A-4B. SEM images of SWNTs deposited in ~100 nm diameter by 50 nm deep windows in $SiN_x$ over Co using electrophoresis with bias of 10 V and deposition time of 10 min. a) Representative area showing that all holes are populated and no SWNTs are observed on the surface of the $SiN_x$ as compared to before deposition shown in the inset. Scale bar is 200 nm. b) High magnification image of a window filled with one SWNT (or bundle) near the center of the via. Scale bar is 100 nm.

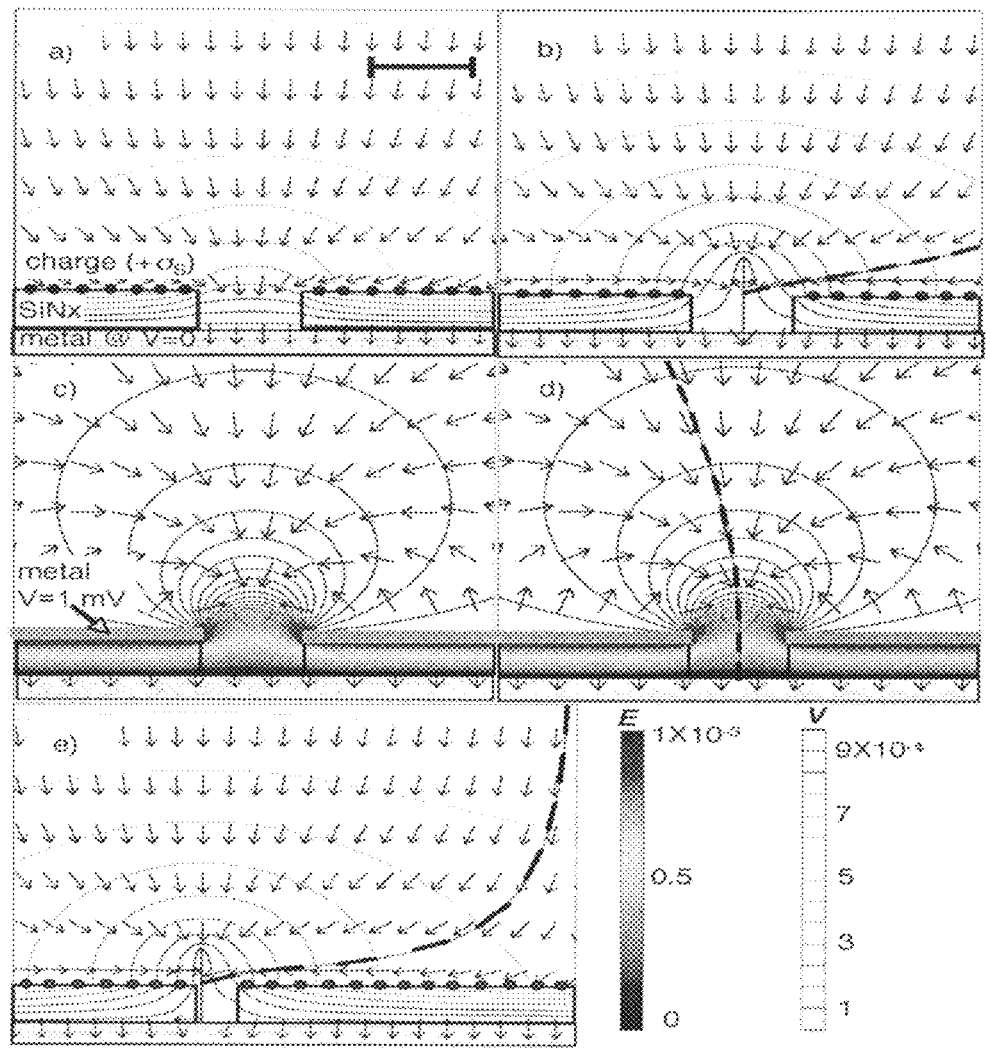
Figures 5A-5E. Finite element calculations of electric field for 50 nm deep window in SiNx over metal. The scale bar in (a) is 100 nm and represents the magnification of all of the plots.

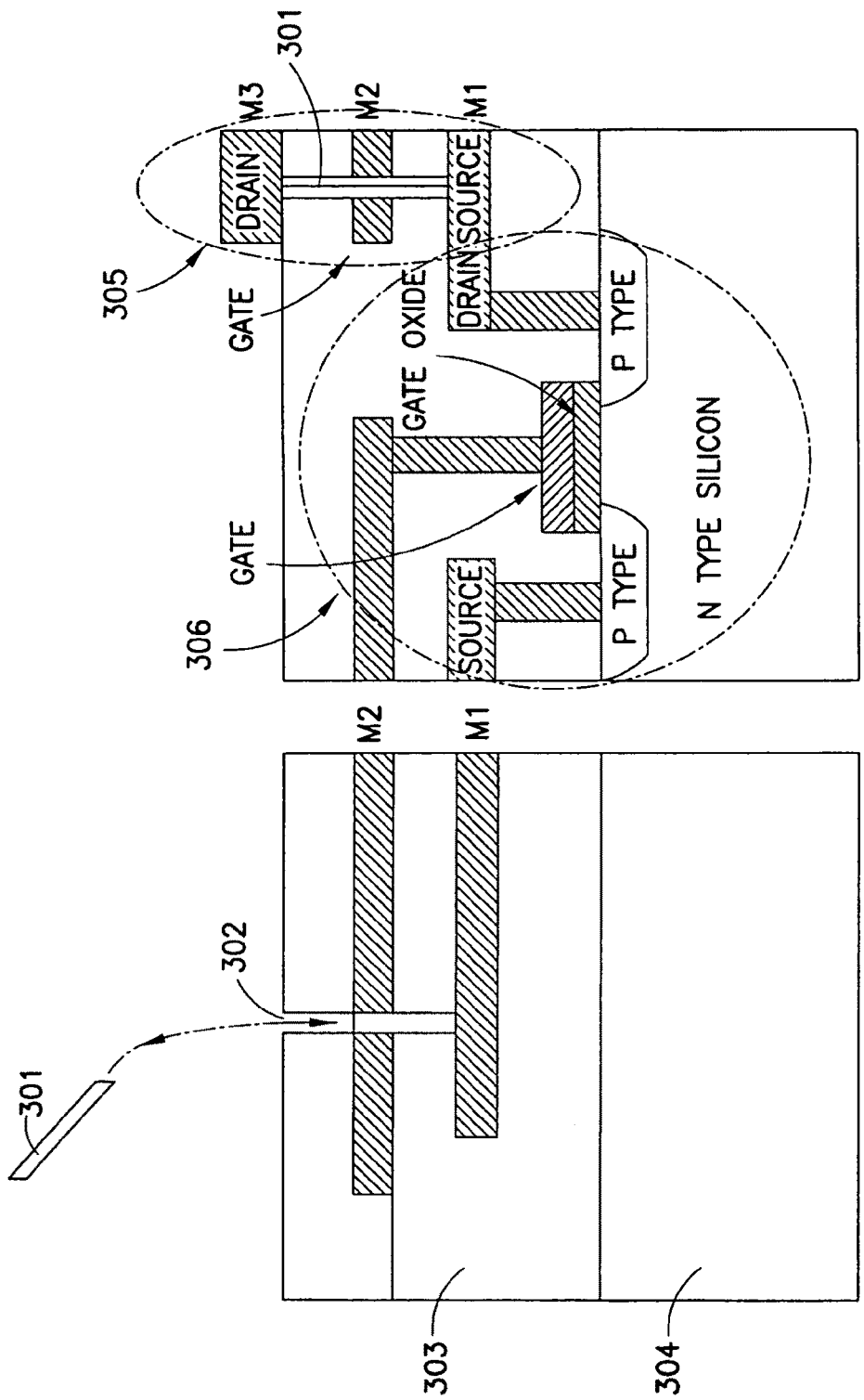

SYSTEM AND METHOD FOR DIRECTED SELF-ASSEMBLY TECHNIQUE FOR THE CREATION OF CARBON NANOTUBE SENSORS AND BIO-FUEL CELLS ON SINGLE PLANE

CROSS REFERENCE TO RELATED APPLICATIONS

This application claims the benefit of U.S. Provisional App. Nos. 61/160,065, filed Mar. 13, 2009, and 61/237,339, filed Aug. 27, 2009, both of which being herein incorporated by reference in their entireties; and claims priority to and is a continuation-in-part of co-pending U.S. patent application Ser. Nos. 11/765,788 and 11/765,735, filed Jun. 20, 2007, both of which being herein incorporated by reference in their entireties.

STATEMENT OF GOVERNMENT RIGHTS

The work described in this patent disclosure was sponsored by the U.S. Department of Defense's Defense Advanced Research Projects Agency ("DARPA") grants FA9550-05-1-0461, FA8650-08-1-7825 and N00014-08-1-0278.

TECHNICAL FIELD

The present disclosure generally relates to the fields of nanotubes (e.g., carbon nanotubes), nanotube devices, electrophoresis, three-dimensional circuits, nanofabrication, transistors, bio-molecular detectors, bio-sensors, and/or bio-fuel cells. More particularly, the present disclosure relates to carbon nanotube sensors and/or bio-fuel cells (e.g., substantially on a single plane), and to directed self-assembly systems and methods for the fabrication of carbon nanotube sensors and/or bio-fuel cells (e.g., substantially on a single plane).

BACKGROUND ART

In general, there has been a great deal of research and development interest in using carbon nanotubes (e.g., single walled carbon nanotubes or SWNTs) as device elements for a host of applications. One of the most difficult problems in the fabrication of carbon nanotube (CNT) devices is the deposition of controlled number(s) of CNTs with specific properties (e.g., including orientation) at predefined locations. If the location and properties of vertically aligned CNTs could be controlled, many important applications could be enabled in many CNT devices (e.g., integrated circuits (ICs), biomedical devices, energy cells, etc.).

Thus, despite efforts to date, a need remains for improved, cost-effective and efficient systems and methods for fabricating nanotube devices. More particularly, a need remains for improved systems and methods for depositing controlled numbers of nanotubes (e.g., vertically aligned CNTs) with specific properties (e.g., including orientation) at predefined locations during the fabrication of nanotube devices. Stated another way, a need remains for improved systems and methods for controlling the location and/or properties of deposited CNTs for use with or for fabrication of CNT devices.

These and other inefficiencies and opportunities for improvement are addressed and/or overcome by the apparatus, systems and methods of the present disclosure.

SUMMARY

The present disclosure provides advantageous nanotube devices, and improved systems and methods for fabricating nanotube devices. More particularly, the present disclosure provides advantageous systems and methods for depositing controlled numbers of CNTs (e.g., vertically aligned CNTs) with specific properties (e.g., including orientation) at predefined locations for use with and/or for the fabrication of CNT devices. For example, the nanotube devices of the present disclosure may be utilized in a wide range of applications, including, for example, as improved biomedical devices, energy cells, integrated circuits (ICs), three-dimensional circuits, transistors, bio-molecular detectors, sensors, and/or bio-fuel cells. For example, bio-fuel cells engineered on a molecular scale may provide a continuously renewable, tailored power source for a wide range of applications, including, for example, targeted drug delivery, physiological monitoring and control, synthetic organs, prostheses, and other advanced medical devices (e.g., pacemakers, insulin pumps, glucose and pressure sensors, and bionic devices for stimulating the brain and spinal cord).

Exemplary embodiments of the present disclosure provide novel methods to fabricate individual or controlled arrays of interconnected vertically oriented SWNTs using electrophoresis (e.g., with applications as transistors, single/multiple element bio-molecular detectors, bio-fuel cells, etc.).

In exemplary embodiments, the present disclosure provides improved carbon nanotube sensors and/or bio-fuel cells (e.g., substantially on a single plane), and improved systems and methods (e.g., directed self-assembly systems and methods) for the fabrication of carbon nanotube sensors and/or bio-fuel cells (e.g., substantially on a single plane).

In one embodiment, the present disclosure provides for a single wall carbon nanotube (SWNT) based enzymatic bio-fuel cell that does not need a proton exchange membrane (unlike hydrogen fuel cells) or mediator molecules to transfer charges to the electrodes. Exemplary embodiments provide systems and methods to deposit vertically aligned SWNTs on metal interconnects with control over the location and number of deposited nanotubes. As such, the present disclosure provides for the fabrication of micron scale enzymatic bio-fuel cells on a single plane that are nano-scalable.

The present disclosure provides for a bio-fuel cell including a substrate having positioned thereon a first conductive member and a second conductive member with an insulating layer positioned over the substrate and the first and second conductive members, the insulating layer: (i) having a first aperture formed therein exposing a first region of the first conductive member, with an electrophoretically deposited first nanotube having a first end in contact with the exposed first region of the first conductive member, and (ii) having a second aperture formed therein exposing a second region of the second conductive member, with an electrophoretically deposited second nanotube having a first end in contact with the exposed second region of the second conductive member; the first nanotube electrically coupled to the second nanotube, the first nanotube configured to be a cathode and the second nanotube configured to be an anode; and an electrolyte in electrical communication with the cathode and the anode.

The present disclosure also provides for a bio-fuel cell wherein the insulating layer is configured to generate an electric field around the first and second apertures; wherein the first and second apertures are each sized to allow a plurality of nanotubes to contact the exposed first and second regions of the first and second conductive members; and wherein after the first and second nanotubes are electrophoretically deposited, the deposited first and second nanotubes are each adapted to reconfigure the electric field to thereby prevent other nanotubes from the plurality of nanotubes from being deposited on the exposed first and second regions of the first and second conductive layers.

The present disclosure also provides for a bio-fuel cell wherein the first and second apertures each have a diameter of at least about 40 nm. The present disclosure also provides for a bio-fuel cell wherein a top surface of the substrate defines a horizontal plane; and wherein the first and second conductive members are both positioned on the horizontal plane of the substrate. The present disclosure also provides for a bio-fuel cell wherein the deposited first and second nanotubes are oriented substantially perpendicular with respect to the horizontal plane.

The present disclosure also provides for a bio-fuel cell wherein the bio-fuel cell does not require a proton exchange membrane or mediator molecules to transfer charges to the anode and cathode. The present disclosure also provides for a bio-fuel cell wherein the cathode and anode are configured to provide electrical power to an electrical device. The present disclosure also provides for a bio-fuel cell wherein the electrical device is positioned at least in part on the substrate. The present disclosure also provides for a bio-fuel cell wherein the cathode and anode are integrated with the electrical device. The present disclosure also provides for a bio-fuel cell wherein the electrical device is an integrated circuit; and wherein the substrate is silicon. The present disclosure also provides for a bio-fuel cell wherein the integrated circuit is a complementary metal oxide semiconductor integrated circuit. The present disclosure also provides for a bio-fuel cell wherein the cathode is connected to a negative supply for a nMOS circuit and the anode is connected to a positive supply for a pMOS circuit.

The present disclosure also provides for a bio-fuel cell wherein the first and second nanotubes are partially carboxylated nanotubes. The present disclosure also provides for a bio-fuel cell wherein the cathode is functionalized with a first enzyme after deposition; and wherein the anode is functionalized with a second enzyme after deposition. The present disclosure also provides for a bio-fuel cell wherein the first enzyme is laccase and the second enzyme is glucose oxide.

The present disclosure also provides for a bio-fuel cell further including an electrophoretically deposited third nanotube having a first end in contact with the exposed first region of the first conductive member; an electrophoretically deposited fourth nanotube having a first end in contact with the exposed second region of the second conductive member; the first and third nanotubes configured to be the cathode and the second and fourth nanotubes configured to be the anode. The present disclosure also provides for a bio-fuel cell further including a first network of a first plurality of nanotubes associated with the first nanotube and a second network of a second plurality of nanotubes associated with the second nanotube; the first nanotube and the first network configured to be the cathode and the second nanotube and the second network configured to be the anode.

The present disclosure also provides for a method of fabricating a bio-fuel cell including providing a substrate having positioned thereon a first conductive member and a second conductive member with an insulating layer positioned over the substrate and the first and second conductive members; forming a first aperture in the insulating layer to expose a first region of the first conductive member; forming a second aperture in the insulating layer to expose a second region of the second conductive member; generating an electric field proximate to the first and second apertures, the electric field configured to direct a plurality of nanotubes towards the first and second exposed regions of the first and second conductive members; depositing a first nanotube on the first exposed region of the first conductive member and a second nanotube on the second exposed region of the second conductive member by electrophoresis, the deposited first nanotube having one end contacting the first exposed region of the first conductive member and the deposited second nanotube having one end contacting the second exposed region of the second conductive member; configuring the first nanotube to be a cathode and the second nanotube to be an anode; electrically coupling the cathode to the anode; and providing an electrolyte in electrical communication with the cathode and anode.

The present disclosure also provides for a method of fabricating a bio-fuel cell wherein the first and second apertures are each sized to allow a plurality of nanotubes to contact the exposed first and second regions of the first and second conductive members; and wherein after the first and second nanotubes are deposited, the deposited first and second nanotubes are each adapted to reconfigure the electric field to thereby prevent other nanotubes from the plurality of nanotubes from being deposited on the exposed first and second regions of the first and second conductive layers.

The present disclosure also provides for a method of fabricating a bio-fuel cell wherein the first and second apertures each have a diameter of at least about 40 nm. The present disclosure also provides for a method of fabricating a bio-fuel cell wherein a top surface of the substrate defines a horizontal plane; and wherein the first and second conductive members are both positioned on the horizontal plane of the substrate. The present disclosure also provides for a method of fabricating a bio-fuel cell wherein the deposited first and second nanotubes are oriented substantially perpendicular with respect to the horizontal plane. The present disclosure also provides for a method of fabricating a bio-fuel cell wherein the fabricated bio-fuel cell does not require a proton exchange membrane or mediator molecules to transfer charges to the anode and cathode.

The present disclosure also provides for a method of fabricating a bio-fuel cell further including configuring the cathode and anode to provide electrical power to an electrical device. The present disclosure also provides for a method of fabricating a bio-fuel cell further including positioning the electrical device at least in part on the substrate. The present disclosure also provides for a method of fabricating a bio-fuel cell further including integrating the cathode and anode with the electrical device. The present disclosure also provides for a method of fabricating a bio-fuel cell wherein the electrical device is an integrated circuit; and wherein the substrate is silicon. The present disclosure also provides for a method of fabricating a bio-fuel cell wherein the integrated circuit is a complementary metal oxide semiconductor integrated circuit. The present disclosure also provides for a method of fabricating a bio-fuel cell further including connecting the cathode to a negative supply for a nMOS circuit and connecting the anode to a positive supply for a pMOS circuit.

The present disclosure also provides for a method of fabricating a bio-fuel cell wherein the first and second nanotubes are partially carboxylated nanotubes. The present disclosure also provides for a method of fabricating a bio-fuel cell wherein the configuring the first nanotube to be the cathode step includes functionalizing the first nanotube with a first enzyme after deposition of the first nanotube; and wherein the configuring the second nanotube to be the anode step includes functionalizing the second nanotube with a second enzyme after deposition of the second nanotube. The present disclosure also provides for a method of fabricating a bio-fuel cell wherein the first enzyme is laccase and the second enzyme is glucose oxide.

The present disclosure also provides for a method of fabricating a bio-fuel cell further including associating a first network of a first plurality of nanotubes with the first deposited nanotube and associating a second network of a second plurality of nanotubes with the second nanotube; configuring the first nanotube and the first network to be the cathode and configuring the second nanotube and the second network to be the anode.

The present disclosure also provides for a method of fabricating a bio-fuel cell including providing a substrate having positioned thereon a first conductive member and a second conductive member with an insulating layer positioned over the substrate and the first and second conductive members; forming a first elongated aperture in the insulating layer to expose a first region of the first conductive member, the first elongated aperture having a first width and a first length larger than the first width; forming a second elongated aperture in the insulating layer to expose a second region of the second conductive member, the second elongated aperture having a second width and a second length larger than the second width; generating an electric field proximate to the first and second apertures, the electric field configured to direct a first plurality of nanotubes towards the first and second exposed regions of the first and second conductive members; depositing: (i) a second plurality of nanotubes in a first line pattern on the first exposed region of the first conductive member, and (ii) a third plurality of nanotubes in a second line pattern on the second exposed region of the second conductive member, by electrophoresis; configuring at least a first nanotube from the second plurality to be a cathode and configuring at least a second nanotube from the third plurality to be an anode; electrically coupling the cathode to the anode; providing an electrolyte in electrical communication with the cathode and anode; wherein the width of the first aperture is sufficiently small to restrict deposition of the second plurality of nanotubes to the first line pattern and the number of nanotubes in the second plurality is determined at least in part by the length of the aperture; wherein the width of the second aperture is sufficiently small to restrict deposition of the third plurality of nanotubes to the second line pattern and the number of nanotubes in the second plurality is determined at least in part by the length of the aperture; wherein the number of nanotubes in the first plurality of nanotubes is greater than the number of nanotubes in the second plurality of nanotubes, and wherein the number of nanotubes in the first plurality of nanotubes is greater than the number of nanotubes in the third plurality of nanotubes.

The present disclosure also provides for a method of fabricating a bio-fuel cell wherein after the second and third plurality of nanotubes are deposited, the deposited second and third plurality of nanotubes each re-configure the electric field to thereby prevent other nanotubes from the first plurality of nanotubes from being deposited on the first and second exposed regions of the first and second conductive members.

Additional advantageous features, functions and applications of the disclosed systems and methods of the present disclosure will be apparent from the description which follows, particularly when read in conjunction with the appended figures.

BRIEF DESCRIPTION OF THE DRAWINGS

To assist those of ordinary skill in the art in making and using the disclosed systems and methods, reference is made to the appended figures, wherein:

FIGS. 2A-2E are schematic diagrams illustrating an experimental setup and a process sequence for depositing a carbon nanotube according to an exemplary embodiment of the present disclosure;

FIGS. 4A-4B depict SEM images of SWNTs deposited in about 100 nm diameter by about 50 nm deep windows in $SiN_x$ over Co using electrophoresis with a bias of 10 V and deposition time of 10 min. FIG. 4A (scale bar 200 nm) depicts a representative area showing that all holes are populated and substantially no SWNTs are observed on the surface of the $SiN_x$ as compared to before deposition shown in the inset. FIG. 4B (scale bar 100 nm) depicts a high magnification image of a window filled with one SWNT (or bundle) near the center of the via;

FIGS. 5A-5E depict finite element calculations of an electric field for 50 nm deep window in $SiN_x$ over metal. The scale bar in FIG. 5A is 100 nm and represents the magnification of all of the plots (FIGS. 5A-5E);

FIG. 8A depicts a schematic of SWNT deposition in a window in a stack of metal (M1, M2) and dielectric material. FIG. 8B depicts an interconnection of a carbon nanotube vertical transistor (CNVT) with a standard silicon transistor;

FIGS. 15A-15C depict typical results. The scale bar in each micrograph is 200 nm;

DETAILED DESCRIPTION

Figure 1:
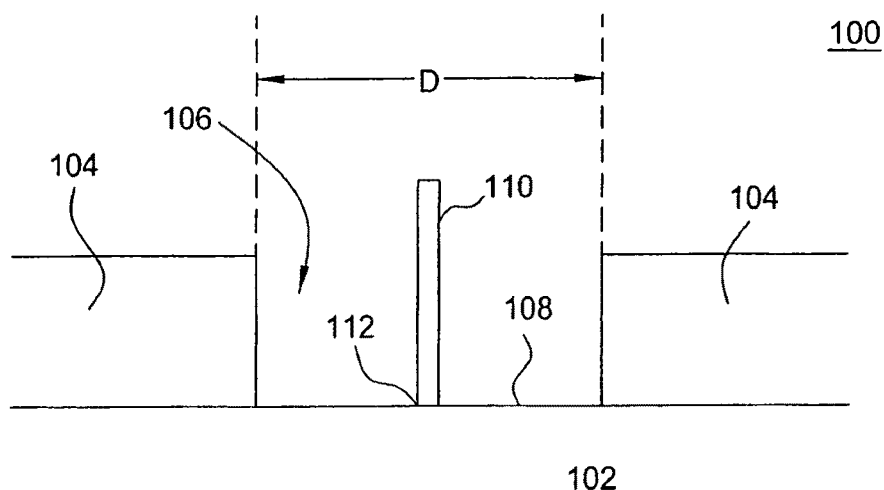
FIG. 1 is a schematic cross-sectional view of a nanotube-based structure that can be fabricated using exemplary embodiments of the present disclosure.

The present disclosure aids those skilled in the art in practicing the systems/methods of the present disclosure. Those of ordinary skill in the art may make modifications and variations in the embodiments described herein without departing from the spirit/scope of the present disclosure. Unless otherwise defined, the technical/scientific terms used herein have the same meaning as commonly understood by one of ordinary skill in the art to which this disclosure belongs. The terminology used in this disclosure is for describing particular embodiments only and is not intended to be limiting. All publications, applications, patents, figures and other references mentioned herein are incorporated by reference in their entirety.

The present disclosure provides for improved nanotube devices and advantageous systems and methods for fabrication thereof. More particularly, the present disclosure provides improved systems/methods for depositing controlled numbers of CNTs (e.g., vertically aligned SWNTs) with specific properties (e.g., including orientation) at predefined locations for use with and/or for the fabrication of CNT devices. Exemplary CNT devices of the present disclosure may be utilized in a wide range of applications (e.g., as improved biomedical devices, energy cells, ICs, three-dimensional circuits, transistors, bio-molecular detectors, and/or bio-fuel cells).

In general, the present disclosure provides novel methods to fabricate individual or controlled arrays of interconnected vertically oriented SWNTs using electrophoresis. In exemplary embodiments, the present disclosure provides for improved carbon nanotube sensors and/or bio-fuel cells substantially on a single plane, and improved systems and methods (e.g., directed self-assembly systems and methods) for the fabrication of carbon nanotube sensors and/or bio-fuel cells substantially on a single plane.

In one embodiment, the present disclosure provides for a SWNT-based enzymatic bio-fuel cell that does not need a proton exchange membrane or mediator molecules to transfer charges to the electrodes. Exemplary embodiments provide systems and methods to deposit vertically aligned SWNTs on metal interconnects, with control over the location and number of deposited nanotubes. The present disclosure provides for the fabrication of micron scale enzymatic bio-fuel cells on a single plane that are nano-scalable.

Directed Self-Assembly of SWNTs:

There are many applications where a nanotube (or an array of nanotubes) can be utilized as a sensing or active device element in an electrical device or electrical probe. In general, electrical contact should be made with the nanotube, which requires accurate positioning of the nanotube with respect to various conductive links (e.g., interconnects) and/or other circuitry. Additionally, properties of the nanotube also should be controlled in order to provide desired device performance.

In exemplary embodiments of the present disclosure (e.g., for fabricating nanotube devices), the location and number of nanotubes is controlled with respect to the electrical interconnects. Along with this requirement of precise alignment and registration, the present disclosure provides for the control of the properties of the nanotubes such that the fabricated devices will perform within a specifically defined parameter space. For example, semiconductor CNTs with a narrow range of bandgaps are needed for transistors and metallic CNTs are needed for bio-fuel cells and certain bio-nano-probes and/or bio-sensors. Previously reported CNT vertical device fabrication methods do not fully address both the constraints of alignment and electrical property control (see, e.g., W. B. Choi, E. Bae, D. Kang, S. Chae, B. Cheong, J. Ko, E. Lee, and W. Park, "Aligned carbon nanotubes for nano-electronics," *Nanotechnology,* 15 (10), S512-S516 (2004); and G. S. Duesberg, A. P. Graham, F. Kreupl, M. Liebau, R. Seidel, E. Unger, and W. Hoenlein, "Ways towards the scaleable integration of carbon nanotubes into silicon based technology," *Diamond and Related Materials,* 13 (2), 354-361 (2004)).

For example, process integration of CNTs with traditional complementary metal oxide semiconductors (CMOS) ICs is difficult. Exemplary embodiments of the present disclosure provide for electrophoresis deposition of nanotubes (e.g., vertical SWNTs), which allows for the control of the number of deposited nanotubes and positioning within a defined region. In general, electrophoresis deposition (EPD) is an efficient and cost effective method. Pre-synthesized CNTs are typically suspended in a solution that contains a metal salt. See, e.g., A. Goyal, S. Liu, Z. Iqbal, L. A. Fetter, and R. C. Farrow, "Directed Self-Assembly of Individual Vertically Aligned Carbon Nanotubes," *J. Vac. Sci. Technol.,* B 26, 2524-2528 (2008). The nanotubes are typically deposited on a metal-coated substrate by electrostatic attraction when a voltage is applied between the substrate metal and another electrode. The adhesion mechanism is an electrochemical interaction between the SWNTs and the metal contact, which is facilitated by the salt that releases metal ions that charge the carbon nanotubes. Depositing a thin insulating layer over the metalized substrate and opening very small windows to the metal can control the area of deposited nanotubes.

Notably, by using electrophoresis, it has been found that if the windows are small enough, the carbon nanotube deposition is limited to only one per window even though the diameter of the windows may be about 50 times larger than the diameter of the SWNT. As such, each window becomes a single particle nanoscopic lens because the electric field around the first deposited nanotube excludes deposition of others.

Exemplary embodiments of the present disclosure provide methods of depositing nanotubes in a region defined by an aperture, with control over the number of nanotubes to be deposited, as well as the pattern and spacing of nanotubes. Specifically, electrophoretic deposition, along with proper configuration of the aperture, allows at least one nanotube to be deposited in a target region with nanometer scale precision. Pre-sorting of nanotubes, e.g., according to their geometries or other properties, may be used in conjunction with embodiments of the disclosure to facilitate fabrication of devices with specific performance requirements.

FIG. 1 is a schematic cross-sectional view of a nanotube structure 100 that can be fabricated using embodiments of the present disclosure. The structure 100 includes a substrate 102, over which an insulating material layer 104 has been deposited. The insulating layer 104 has been patterned to form an aperture 106, which exposes a top surface 108 of the substrate 102. A single CNT 110 is deposited inside the aperture 106 so that one end 112 of the CNT 110 contacts the top surface of the substrate 102. In one embodiment, the substrate 102 is a conducting material such as a metal or a conducting film (deposited over an insulating material) that allows a bias voltage to be applied for electrophoretic deposition of the nanotube 110.

Embodiments of the present disclosure allow the CNT 110 to be deposited inside the aperture 106, to the exclusion of other CNTs. The aperture 106, which has to be sufficiently large to accommodate the CNT 110, may be patterned using different lithographic processes. Thus, in one embodiment, the aperture 106 may have a diameter (D) ranging from about the lower limit (e.g., resolution) of the lithography process to about 100 nm. For example, certain existing lithography at 193 nm readily provides a resolution limit of about 90 nm. Other existing lithography provides a resolution limit of about 50 nm. In another embodiment, aperture 106 has a diameter (D) ranging from about 10 nm to about 40 nm, or from about 40 nm to about 500 nm.

In one embodiment, the substrate 102 has a lateral dimension (e.g., extending across the aperture) sufficiently large to meet level-to-level overlay constraints with respect to the aperture 106. As will be shown below, the CNT 110 can be deposited proximate the center of the aperture 106, e.g., with a lateral alignment precision of a few nanometers. Furthermore, the CNT 110 may be pre-selected to have a preferred physical property including multiwall CNT versus single wall CNT and/or conducting CNT versus semiconducting CNT.

FIGS. 2A-2D illustrate schematically an experimental setup for electrophoresis and a sequence for depositing a CNT on a substrate according to one embodiment of the present disclosure. In general, electrophoretic deposition (EPD) is driven by the motion of charged particles, dispersed in a suitable solvent, towards an electrode under the influence of an electric field. Particles less than about 30 µm size can be used in suspensions with low solid loading and low viscosity. In general, whether nanotubes are deposited in the form of bundles or individual tubes depends on the nature of the suspension and the relative mobilities of each, which depends on their shapes and the associated resistance to diffuse towards the contact surface inside the apertures or vias.

FIG. 2A shows a substrate structure 200 (e.g., quartz) with a conductive layer 202 (e.g., metal). An insulating layer 204 (e.g., $SiN_x$) is provided over the conductive layer 202, and one or more apertures 206 are patterned in the insulating layer 204. The substrate structure 200 is immersed in a liquid bath 220, e.g., at room temperature, containing an electrolyte and a suspension of CNTs 210 in a suitable solvent. Successful EPD generally requires preparation of a stable dispersion. In general, an electrostatically stabilized dispersion can be obtained with particles of high ζ-potential, while keeping the ionic conductivity of the suspensions low. SWNTs have shown high ζ-potential values at low pH values. It is also known that the presence of charging salts can play an important role in improving adhesion of the nanotubes to substrates and increasing the deposition rates.

In one embodiment, 10 mg of purified SWNTs are suspended in 30 ml of distilled water, and $10^{-4}$ moles of magnesium nitrate hexahydrate [$Mg(NO_3)_2 6H_2O$] is added to the suspension and sonicated for about 2-3 hrs. In general, it is preferable that the nanotubes in the liquid bath 220 be pre-sorted for the type of nanotubes according to application needs. For example, while semiconducting SWNTs are used as active elements in transistors, either semiconducting or metallic nanotubes may be used for probes or other devices. A few drops of non-ionic Triton-X surfactant are added to improve the suspension with a final pH of solution at about 4.

Aside from hydrogen ions ($H^+$), shown as circles in FIG. 2A, the liquid bath 220 also contains magnesium ions, $Mg^{2+}$, which tend to adsorb or attach to the CNTs. An electrode 224, e.g., a platinum electrode, is immersed in the liquid bath 220 and connected to a positive terminal of a DC voltage source 222. The conducting layer 202 is connected to a switch 226.

In FIG. 2A, when the switch 226 is open and there is no current flow inside the liquid bath 220 (current flow may be measured using an ammeter A), the CNTs are randomly distributed in the suspension and any deposition on the substrate will be random.

In FIG. 2B, the switch 226 is closed, thus connecting the conductive layer 202 to a negative terminal of the DC source 222. With a DC potential, e.g., in a range of about 5V-25V, applied across the platinum electrode 224 and the conductive layer 202, charged particles or species and/or any mobile ions in the fluid will move towards either the cathode or the anode. For example, $H^+$ ions, $Mg^{2+}$ ions and positively charged CNTs will move towards the substrate structure 200, which is the cathode in this case. In general, smaller and less massive charged species such as ions will have a higher mobility in the suspension and tend to charge the insulator surface 204 before the nanotubes can arrive at surface 204.

Since the positively charged ions (in this case $H^+$ and $Mg^{2+}$) have higher mobility than the CNTs, these ions will arrive at the substrate structure 200 faster than the CNTs, and thus, preferentially accumulate on the surface of the insulating layer 204, as shown in FIG. 2B. The positively charged surfaces of the insulating layer 204 result in an electric field being produced around each aperture 206.

Positively-charged CNTs arriving near the substrate structure 200 are directed by the electric field towards the center of each aperture 206, as shown in FIG. 2C. Details regarding this "focusing" effect will be presented in later discussions. In one embodiment, the apertures 206 and electric field distribution are configured so that only one CNT (shown as CNT 210*) is deposited inside each aperture 206, even though the diameter (or lateral dimension) of the aperture 206 is large enough to physically accommodate additional CNTs. The CNT 210* is disposed inside each aperture 206 in a "longitudinal" manner, i.e., the length of the CNT 210* is along the same direction as the depth of the aperture 206, with one end of the CNT contacting the conductive layer 202.

FIG. 2D shows that the unattached end of CNT 210* tends to align or point towards the platinum electrode, and further, serves as a focal point for additional CNTs. Thus, a second CNT 210A becomes attached to the free end of CNT 210*, e.g., in a lengthwise manner, with additional CNTs attaching to each other end-to-end. The substrate structure 200 is then removed from the bath 220, washed in distilled and de-ionized water, and dried with an inert gas. After drying, only the CNTs 210* that are attached to the conductive layer 202 remain, and the resulting structure, such as one illustrated in FIG. 2E, is ready for further processing.

Since different devices often require different properties of the nanotubes for proper operation and/or optimum performance, it may be advantageous to provide a pre-sorting of the nanotubes prior to electrophoretic deposition. For example, nanotubes may be sorted according to their properties such as semiconducting versus metallic, single-walled versus multi-walled, or they may be sorted according to geometries or dimensions such as lengths, diameters, and so on.

Since different types of nanotubes have different mobilities, e.g., longer or multiwalled nanotubes will generally have lower mobility compared to shorter or single-walled nanotubes, electrophoresis may also be used for sorting purposes. Such sorting can be done prior to the electrophoretic deposition so that the nanotubes in the bath have a relatively uniform distribution in terms of properties and/or geometries. Alternatively, if the nanotubes in the electrophoresis bath have a relatively wide distribution in terms of geometries or other properties, a certain degree of sorting may also be achieved "in situ" during deposition by virtue of the different mobilities of the nanotubes.

The degree of focusing that directs the nanotubes towards the aperture is affected by the magnitude and shape of the electric field distribution, along with the configuration of the aperture. To provide control over the number of deposited nanotubes as well as their positioning, a finite element model is used to investigate the electric field distribution as a function of various input parameters. Parameters or factors that are relevant for controlling nanotube deposition include the aperture configuration, nanotube properties, characteristics of the insulating layer and substrate, bias potential, dielectric properties of the solution, among others. The aperture configuration may generally include the shape, dimensions (e.g., width, length, depth, ratios of dimensions), sidewall profile, and so on. The nanotube properties may generally include the dimensions (e.g., length, diameter), single-walled or multi-walled, semiconducting or metallic.

The electric field around the aperture results from a combination of the potential applied to the metal layer on the substrate structure and charges that accumulate on the surface of the insulating layer. The positive charge accumulation on the dielectric layer covering the cathode creates an electric field that opposes the field arising from the bias applied between the anode and cathode. Once the two electric fields become equal and opposite, positive charges will no longer be attracted to the surface of the insulating layer.

Figure 3A:
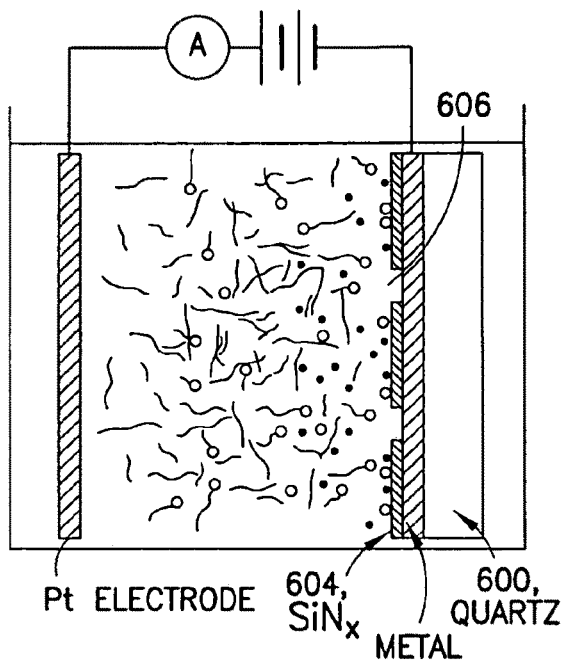
FIGS. 3A-3C are schematic diagrams illustrating another process for electrophoresis deposition (EPD) of CNTs from an aqueous suspension of SWNTs. The circles represent $H^+$ ions (+) and $Mg^{2+}$ ions (++)
Figure 3B:
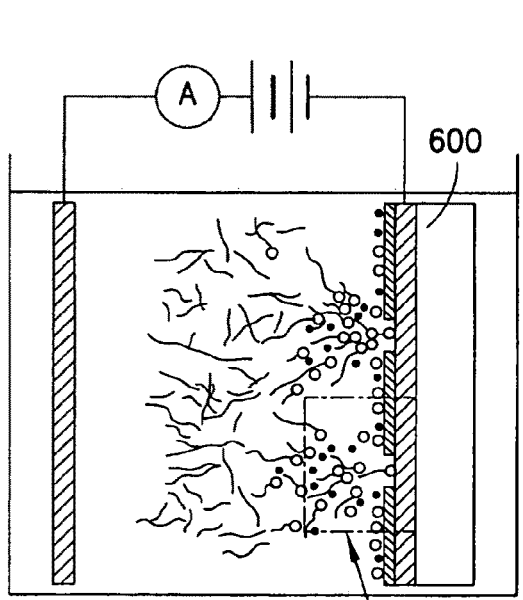
Figure 3C:
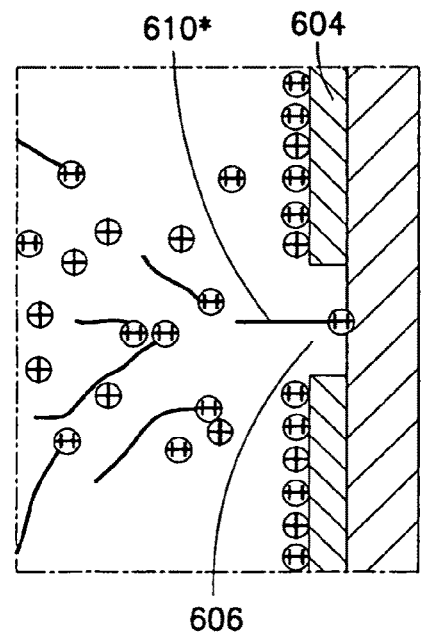

A similar exemplary electrophoresis deposition process is shown schematically in FIGS. 3A-3C, where a magnesium salt is used in the SWNT suspension. When the field is applied (FIG. 3A) ions from the salt and the water move towards the electrodes and ions collect on the insulator 604, which creates a surface charge that can be calculated. The surface charge on the insulator 604 creates an electrostatic lens around the windows or apertures 606. $Mg^{2+}$ can attach to the SWNTs and increase their attraction to the cathode 600. The first SWNT 610* that attaches to the base of the window 606 modifies the electric field (FIG. 3B). If the first SWNT 610* deposits near the center of window 606, subsequent SWNTs will be attracted to the already deposited SWNT 610* (FIG. 3C).

SEM images from experimental results that confirm the above-described nanoscopic lens effect are shown in FIGS. 4A-4B. Micro-Raman spectroscopy was also used to confirm the deposition of SWNTs. FIGS. 4A-4B depict SEM images of SWNTs deposited in about 100 nm diameter by about 50 nm deep windows in $SiN_x$ over Co using electrophoresis with a bias of 10 V and deposition time of 10 min. FIG. 4A (scale bar 200 nm) depicts a representative area showing that all holes are populated and no SWNTs are observed on the surface of the $SiN_x$ as compared to before deposition shown in the inset. FIG. 4B (scale bar 100 nm) depicts a high magnification image of a window filled with one SWNT (or bundle) near the center of the via.

FIGS. 5A-5E depict finite element calculations of an electric field for 50 nm deep window in $SiN_x$ over metal. The scale bar in FIG. 5A is 100 nm and represents the magnification of all of the plots (FIGS. 5A-5E).

The finite element modeling shown in FIGS. 5A-5E predicts the conditions for single SWNT deposition. For example, these conditions are obtainable using processes that are in IC manufacturing facilities. For an applied electric field of $10^3$ V/m, FIG. 5A shows the electric field distribution around a 100 nm diameter window in $SiN_x$ and surface charge density, $\sigma_S = 7.1 \times 10^{-7}$ Coul/$m^2$ (annotated with circles). FIG. 5B shows the electric field distribution after deposition of 1 nm diameter by 100 nm long nanotube at the center with the trace (dashed line) of a positively charged particle approaching from a 350 nm radius from a line that is vertical to the center of the window. The lensing effect may also be controlled by depositing a metal on the insulator and applying a small bias ($V_b = 1.0$ mV) as shown in FIG. 5C. This will direct the nanotube to the center of the window (see FIG. 5D). If the window is small enough the first deposited nanotube will preclude the deposition of others in the same window. This is the case for a 40 nm diameter window as shown in FIG. 5E. Other geometries such as long narrow slots allow the number of deposited nanotubes to be controlled even though the placement is stochastic. Uniform electrical properties may be achieved using commercially available presorted single wall carbon nanotubes.

Figure 6A:
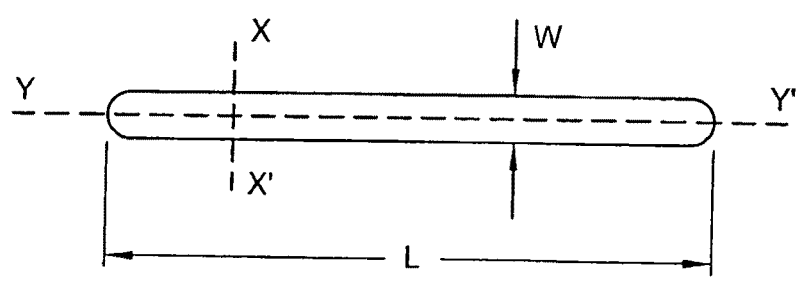
FIGS. 6A-6B are schematic illustrations of a configuration of an aperture suitable for implementing embodiments of the present disclosure.
Figure 6B:
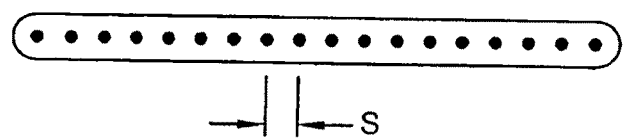

For example, FIGS. 6A-6B are schematic illustrations of a top view of an aperture configuration suitable for controlling nanotube deposition. As shown in FIG. 6A, the aperture has an elongated geometry such as a slot, which is characterized by a width (W), also referred to as a lateral or transverse dimension (along a direction indicated by line X-X'), and a length (L), also referred to as a longitudinal dimension (along a direction indicated by line Y-Y'), with L being larger than W. In this example, the width W is designed to be sufficiently narrow so as to allow only one nanotube to be deposited along the transverse direction. Thus, all deposited nanotubes will be deposited in a line pattern, i.e., lined up adjacent to each other, along the longitudinal direction.

Furthermore, the number of nanotubes deposited within the slot can be controlled by the length of the slot. Once a first nanotube is deposited in the slot, the electric field distribution around the slot will be modified. The new field distribution can be calculated using finite element analysis. The closest separation between adjacent nanotubes can also be calculated by using finite element analysis to predict the trajectory of randomly approaching charged particles that are successively deposited in the slot.

Using this analysis for nanotubes having a length of about 100 nm, it has been estimated that the closest separation between nanotubes with about 1 nm diameter is about 15 nm. For nanotubes with a diameter of about 10 nm and a length of about 100 nm, the closest separation for adjacent nanotubes is about 20 nm. The same method can be used to calculate the closest separation of nanotubes with any geometry. An alternative method can be used to calculate the electric field in the vicinity of two closely spaced nanotubes and reduce the spacing until the calculated electric field has a distribution that would exclude deposition of a third nanotube in between the two that are already deposited.

Embodiments described above can be used for fabricating different nanotube (e.g., CNT) devices. For example, the embodiments described above can be used for fabricating CNT field effect transistors (CNT-FETs). Since the materials and processes for forming a CNT-FET are compatible with those typically used in complementary metal oxide semiconductors (CMOS), such a transistor can readily be integrated with CMOS processing to provide a three dimensional semiconductor structure.

In general, semiconductor single wall CNTs (e.g., SWNTs) with a narrow range of bandgaps are desired for transistors (see, e.g., P. Graham, G. S. Duesberg, W. Hoenlein, F. Kreupl, M. Liebau, R. Martin, B. Rajasekharan, W. Pamler, R. Seidel, W. Steinhoegl, and E. Unger, "How do carbon nanotubes fit into the semiconductor roadmap?," *Applied Physics A: Materials Science & Processing,* 80 (6), 1141-1151 (2005)). Some of the advantages of SWNT transistors include their superior current carrying capacity and other transistor characteristics that are superior to silicon based transistors. Robertson offers a discussion of some of the outstanding issues with current SWNT transistors (J. Robertson, "Growth of nanotubes for electronics," *Materials Today,* 10 (1-2), 36-43 (2007)).

Figure 7A:
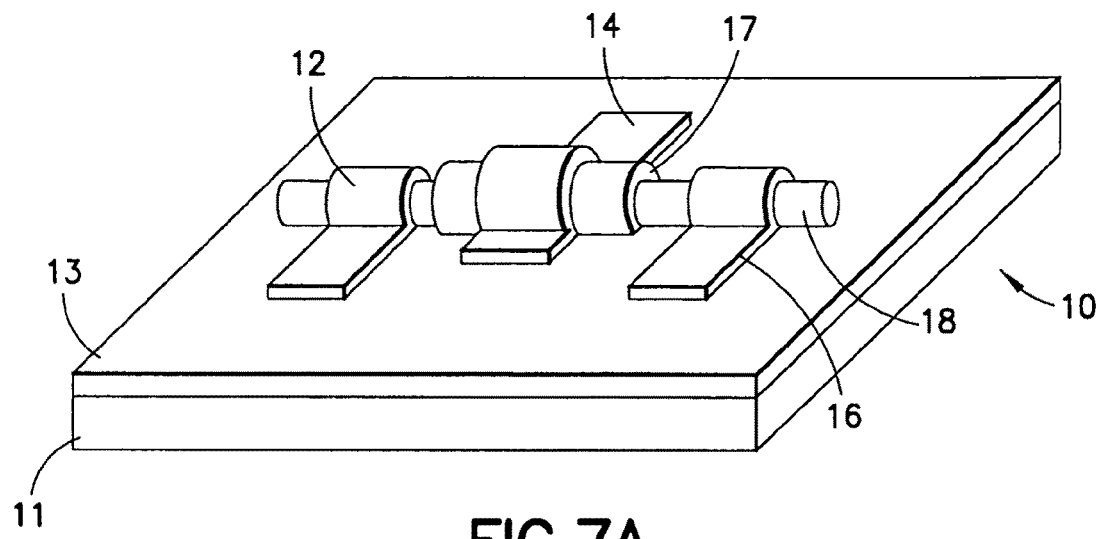
FIG. 7A is a schematic diagram of an exemplary SWNT transistor having planar geometry.
Figure 7B:
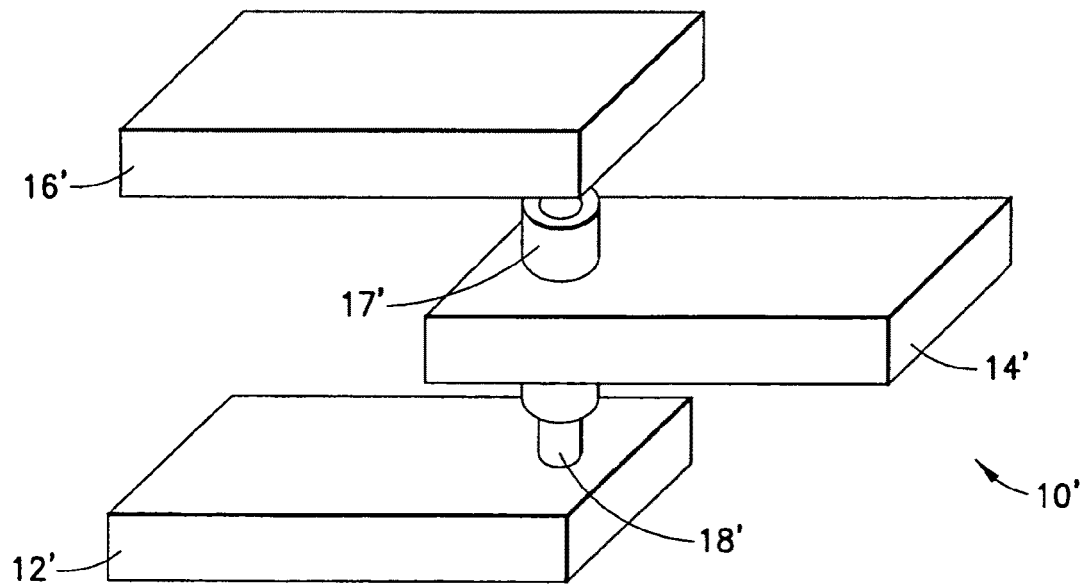
FIG. 7B is a schematic diagram of an exemplary SWNT transistor having vertical geometry.

Some planar geometry transistor devices (shown schematically in FIG. 7A) have been demonstrated. FIGS. 7A-7B depict schematic diagrams of SWNT transistors 10, 10' with: a) planar geometry, and b) vertical geometry. Exemplary transistors 10, 10' typically include a source 12, 12', a gate 17, 17' with gate dielectric 14, 14', a drain 16, 16' and at least one CNT 18, 18' (e.g., SWNT). Transistor 10 typically also includes a substrate 11 having a dielectric layer 13 positioned thereon.

Along with the expected process integration challenges of new materials, the planar geometry SWNT transistor 10 generally relies on advanced lithography that has not been fully developed yet to continue scaling beyond the expected life of silicon based transistors. The vertical SWNT transistor 10' with a wraparound gate 14' (shown schematically in FIG. 7B) is generally only limited in interconnect scaling by lithography since the effective gate length is typically controlled by the thickness of the gate metal. In general, vertical SWNT transistors have largely been relegated to future technology because of the difficulty in growing SWNTs with precisely the right characteristics at precisely the needed or desired locations on a wafer. Another constraint with vertically aligned CNT electrical device fabrication is process integration with traditional complementary metal oxide semiconductor (CMOS) ICs.

Thus, it would be advantageous to incorporate transistors from CNTs and CMOS structures by fabricating vertical CNT logic circuits within the metal levels. Such three-dimensional polylithic architecture greatly increases the functionality of ICs. One constraint to this concept is the current limitation on thermal cycling of CMOS ICs after metal deposition. This may limit the use of many high temperature chemical vapor deposition (CVD) methods for CNT growth when combined with CMOS ICs (see, e.g., Wolf, S. & Tauber, R. N. *"Silicon Processing for the VLSI Era: Process Technology,"* Vol. 1, $2^{nd}$ Edn., Ch 15 (Lattice Press, Sunset Beach, Calif.; 2000)).

In exemplary embodiments of the present disclosure, CNT vertical transistors (CNVT) can be fabricated using variations of the technique shown in FIGS. 8A-8B (and as discussed in U.S. patent application Ser. No. 11/765,788), where individual nanotubes 301 are drawn into prefabricated windows 302 in the metal/dielectric layers.

FIG. 8A depicts a schematic of SWNT 301 deposition in a window 302 in a stack of metal (M1, M2) and dielectric material 303 (over substrate 304, e.g., silicon). FIG. 8B depicts an interconnection of a carbon nanotube vertical transistor (CNVT) 305 with a standard silicon transistor 306. As shown in FIG. 8B, the CNVT 305 typically includes a drain 307, a gate 308 and a source 309. The standard silicon transistor 306 typically includes a drain 310, a gate 311 over a gate oxide 312, and a source 313. In an exemplary embodiment, CNVT 305 is interconnected with the standard silicon transistor 306 with source 309 of CNVT 305 being interconnected with drain 310 of transistor 306. As shown in FIG. 8B, transistor 306 typically includes first substrate 304 (e.g., N type silicon) and second substrate 314 (e.g., P type silicon).

Another advantage of electrophoresis deposition is that it generally is a room temperature process and typically is non-interfering with today's IC processes. That is, by utilizing exemplary embodiments of the present disclosure, it should be possible to interconnect CNVTs and silicon transistors on the same IC (see FIG. 8B). Along with the applications already discussed, there are many other applications for this directed self-assembly technique. These include, without limitation, the controlled placement on other high aspect ratio nanoparticles that are important in electronics and biotechnology.

Bio-sensors:

With regard to biosensors, there is a need to investigate electrochemical and mechanical processes in the interior of living biological cells with sub-optical lateral spatial resolution. In general, the current predominate tool to investigate these processes is the optical microscope even though the sensitivity to chemistry or intracellular forces is at the molecular scale. The clearest examples are optical tweezers and quantum dots (see, e.g., M. Sheetz, Laser Tweezers in Cell Biology, *Methods in Cell Biology*, Vol. 55, [Academic Press, Orlando, Fla.], (1998); and X. Michalet, F. F. Pinaud, L. A. Bentolila, J. M. Tsay, S. Doose, J. J. Li, G. Sundaresan, A. M. Wu, S. S. Gambhir, and S. Weiss, "Quantum Dots for Live Cells, in Vivo Imaging, and Diagnostics," *Science,* 307 (5709), 538-544 (2005). The former has proven ability to measure molecular scale forces and nanometer displacements and the latter can typically detect the presence of single molecules, but both have spatial resolution limited by optical microscopy. Scanning probe devices afford the spatial resolution at the expense of temporal response (e.g., for acquiring an image) and utility in a moving cell environment.

It has been found that an array of interconnected CNT nanoprobes may offer a cell measurement solution that can improve the advantageous attributes of the currently used techniques. For example, such a device could detect the coordinated electrochemical and mechanical events of a motile cell with molecular sensitivity and sub-100 nm spatial resolution. This could be achieved with a relatively benign affect on the cells activity.

Figure 9A:
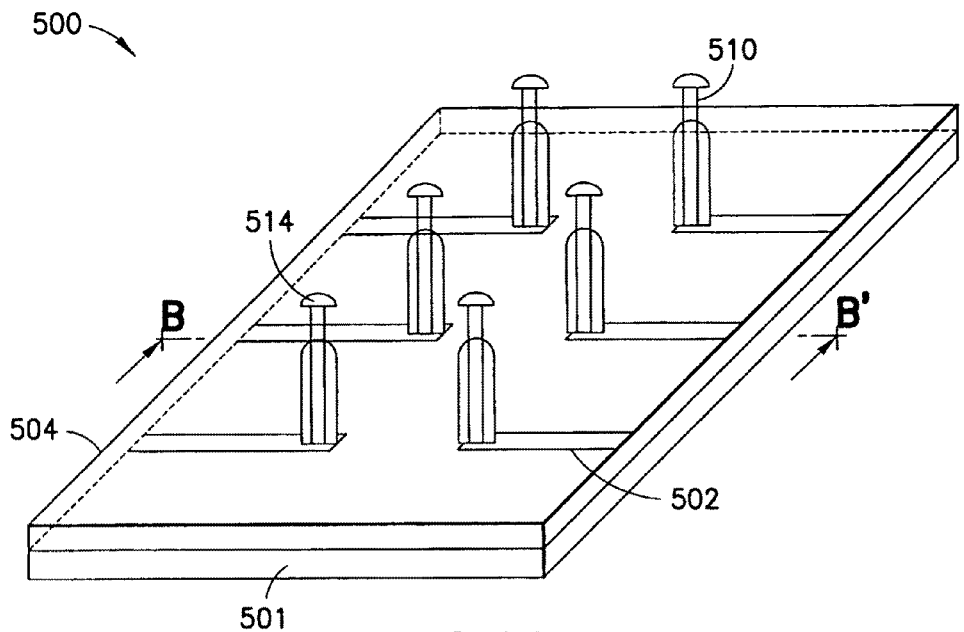
FIG. 9A depicts an exemplary layout of a bio-nanoprobe or nanotube sensor array using functionalized SWNTs according to the present disclosure.
Figure 9B:
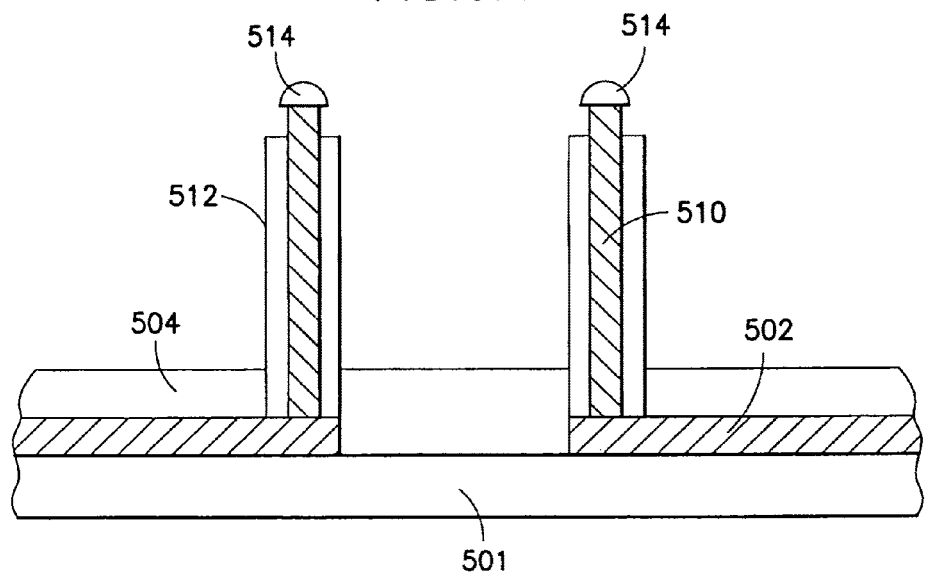
FIG. 9B is a cross-sectional view of the array of FIG. 9A.

FIG. 9A is a schematic illustration of a nanotube-based sensor or bio-nanoprobe array device 500 according to an exemplary embodiment of the present disclosure, and FIG. 9B is a cross-sectional view along a vertical plane containing line B-B'. Device 500 generally includes one or more nanotubes 510 that are deposited over a substrate 501. A conductive material 502, e.g., a metal, is formed at selected regions of the substrate 501 to provide conductive paths to the nanotubes 510. Nanotubes 510 can be deposited onto the conductive material 502 using electrophoresis as previously described, e.g., by forming apertures in an insulating layer 504 provided over the conductive material 502, and applying a bias voltage to the conductive material 502. A sheath 512 is also formed around each nanotube 510 to provide passivation and insulation for the nanotube 510. By insulating the sidewalls of the nanotubes 510 and leaving only the tips exposed, potential background noise may be reduced, thus increasing the electrical sensitivity of the sensor. The interconnects to the nanotubes 510 may be used for measuring changes in the CNT electrical characteristics. A device similar to that shown in FIGS. 5A-B may be used for investigating intracellular activities in biological cells. Specifically, a CNT is a good candidate for such a probe because its small diameter (e.g., compared to cell membrane thickness) can minimize distortions to the cell that is being investigated with the probe.

Depending on the specific sensor applications, different functional molecules 514 are provided to the other end of the nanotube 510. In general, SWNTs are preferred for sensor applications, although there may be situations in which MWNTs may also be used.

As shown in FIG. 9A, exemplary bio-nanoprobe array 500 utilizes functionalized nanotubes 510 (e.g., functionalized SWNTs). In exemplary embodiments, the SWNTS of array 500 have functionalized tips 514. In general, the nanoprobe array 500 should possess some very novel properties to realize its potential utility. For example, the diameter of the nanoprobes 510 should be on the order of the plasma membrane thickness (e.g., about 3.5 nm) to easily penetrate the membrane with minimal effect on cell motility. Moreover, each nanoprobe 510 should be individually addressable. The nanoprobes 510 should be functionalized to be sensitive to specific cellular events. As noted and since these are electrical probes, the shafts of the probes should be insulated up to the active tip to maximize sensitivity and minimize crosstalk between probes. A SWNT may be configured to satisfy these requirements.

In one embodiment, substrate layer 501 is a quartz wafer that is compatible with optical microscopy, and insulating layer 504 is silicon nitride positioned or deposited on substrate layer 501, with a plurality of conductive members or layers 502 (e.g., interconnect metal members) positioned between the substrate layer 501 and the insulating layer 504.

In general, most of the processes for fabricating an interconnected SWNT array 500 face challenges when integrated into a device. Many of the challenges are similar to those encountered in fabricating vertical CNT transistors, as discussed above.

Bio-fuel Cells:

Recent developments in bio-fuel cell technology may also lead to applications for CNT interconnected arrays and avenues for integrated power systems for circuits (F. Davis and S. P. J. Higson, "Biofuel cells—Recent advances and applications," *Biosensors and Bioelectronics*, 22 (7), 1224-1235 (2007)). In exemplary embodiments, the present disclosure provides for bio-fuel cells that do not require a proton exchange membrane separator and/or do not need a mediator to transfer charge. The absence of a membrane in the bio-fuel cell configuration generally opens up the possibility of other configurations that would otherwise be unfeasible.

Figure 10:
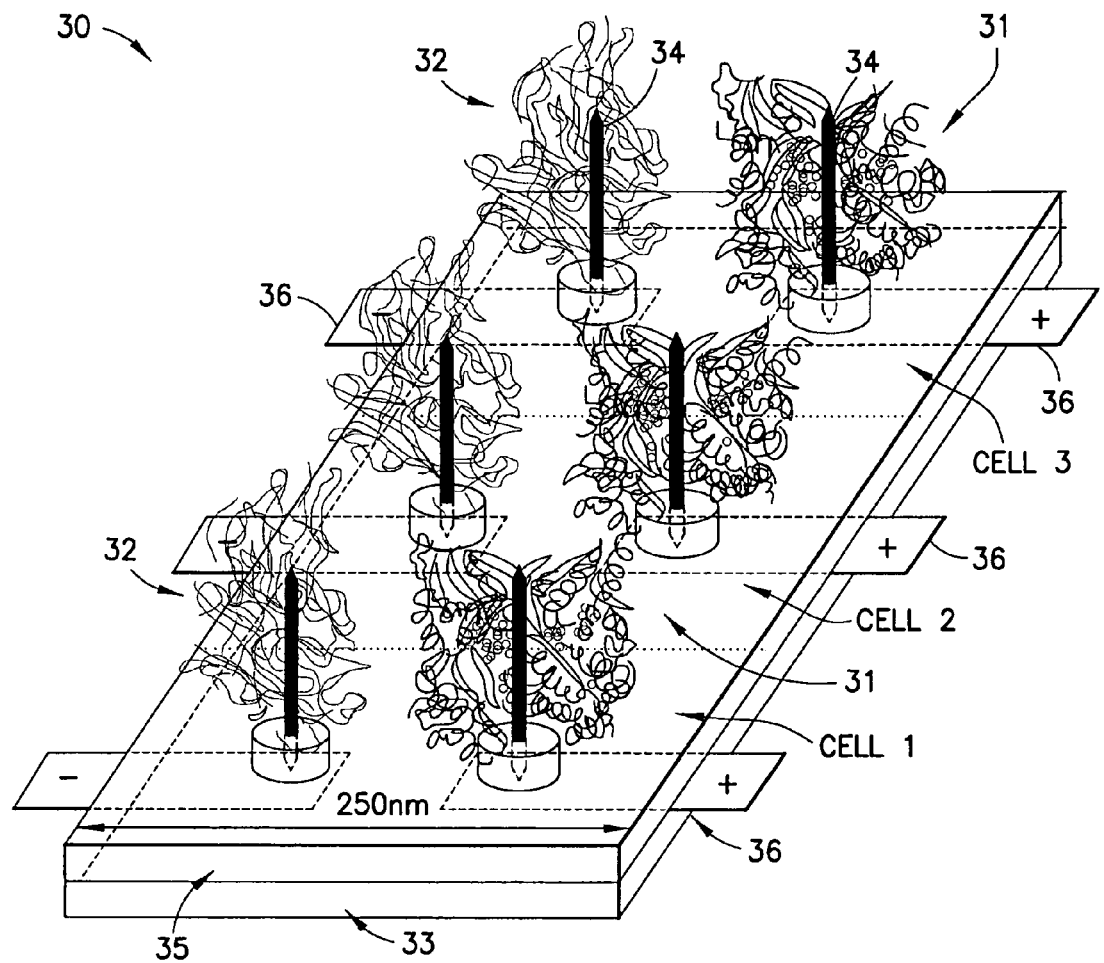
FIG. 10 depicts a planar bio-fuel cell using partially carboxylated SWNT (c-SWNT) cathodes (further functionalized with cathodic laccase) and anodes (further functionalized with glucose oxide) according to an exemplary embodiment of the present disclosure.

FIG. 10 depicts a planar bio-fuel cell 30 using partially carboxylated SWNT (c-SWNT) cathodes 32 (further functionalized with cathodic laccase) and c-SWNT anodes 31 (further functionalized with glucose oxide) according to an exemplary embodiment of the present disclosure. More particularly, this improved bio-fuel cell 30 features bio-anodes 31 and bio-cathodes 32 on the same substrate 33, with SWNTs 34 functionalized with —COOH groups (c-SWNT) being vertically oriented and further functionalized with enzymes (e.g., cathodic laccase and glucose oxide).

Substrate 33 (e.g., silicon/silicon wafer) typically includes insulating layer 35 (e.g., silicon nitride) positioned/deposited thereon, with conductive interconnect layer, members or structures 36 (e.g., a plurality of conductive members or metal micro-rail interconnect members) positioned between substrate layer 33 and insulating layer 35. As shown in FIG. 10, since electrodes 31, 32 can share the same substrate 33, the entire configuration 30 may be integrated with a circuit device on the same substrate 33. That is, an IC and its power source 30 may be fabricated on the same silicon wafer 33 (e.g., with some additional process steps). One difficulty with achieving the configuration in FIG. 10 that the present disclosure addresses (and as discussed above/below) is the controlled placement of the c-SWNTs 34 that act as charge channels. For example and as discussed below, for closely spaced windows/apertures, it is important that the number of nanotubes be controlled, otherwise adjacent contacts may short out.

Figure 11:
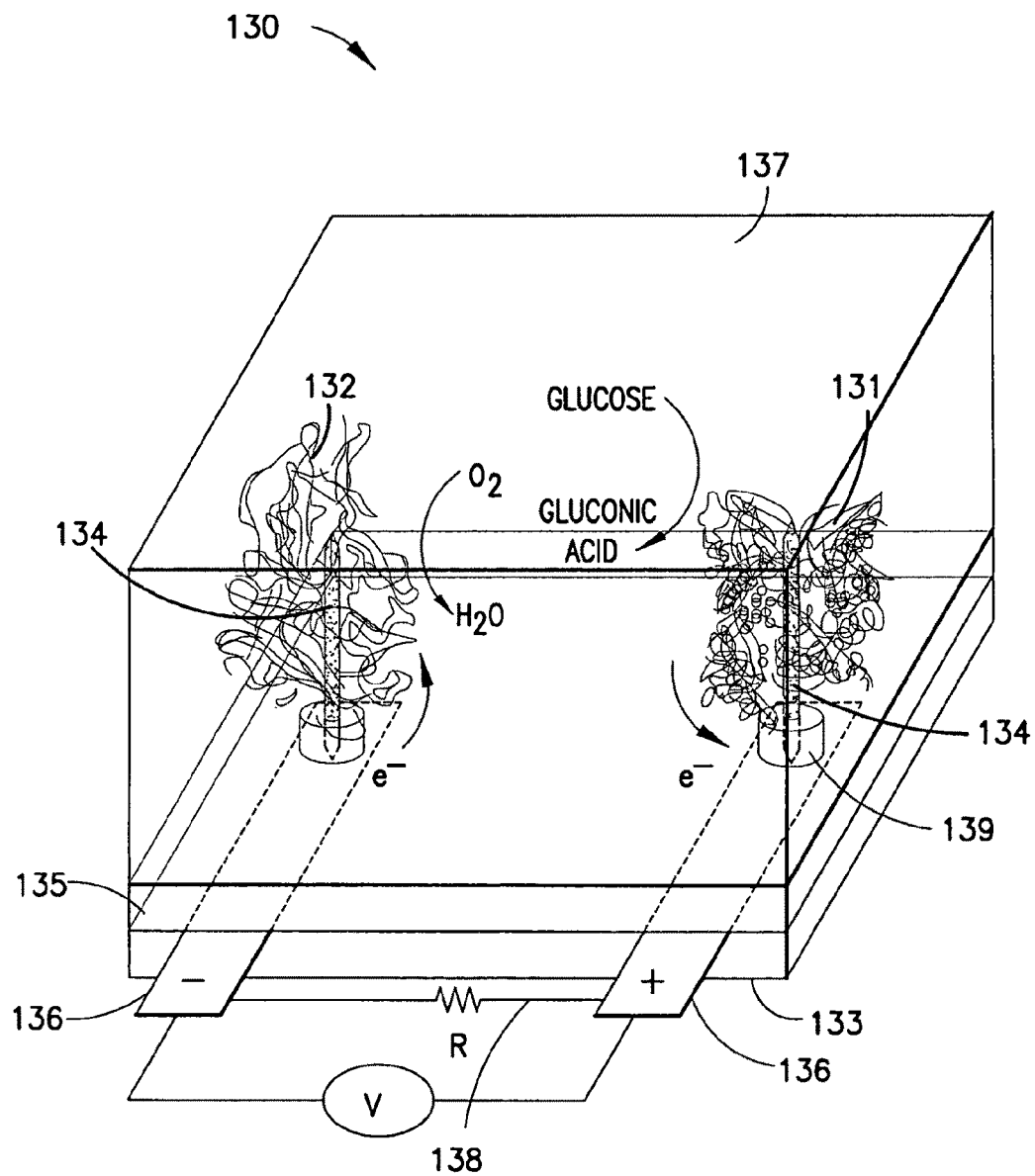
FIG. 11 depicts a schematic of an exemplary enzymatic bio-fuel cell using single wall carbon nanotubes (SWNTs) functionalized with glucose oxidase (GOx) and laccase (Lac) as electrodes in an electrolyte solution containing glucose and oxygen.

A bio-fuel cell architecture 130 fabricated for another exemplary embodiment of the present disclosure is shown schematically in FIG. 11 where SWNTs 134 are electrochemically functionalized with enzymes, glucose oxidase (GOx) and laccase (Lac), to form the anode 131 and cathode 132, respectively. See, S. C. Wang et al., *Electrochemistry Communications*, 11, 34 (2009) in regards to methods for laccase (Lac) and glucose oxidase (GOx) functionalization. The structure of this exemplary embodiment was immersed in an electrolyte solution 137 (e.g., a glucose solution) in phosphate buffer which contains oxygen. A load 138 (e.g., a resistor) was then connected or electrically coupled between the anode 131 (GOx/SWNTs) and the cathode 132 (Lac/SWNTs), and an electrical current was generated as the GOx oxidizes the glucose and Lac reduces the oxygen.

Similar to bio-fuel cell 30 of FIG. 10, substrate 133 (e.g., silicon or silicon wafer) of bio-fuel cell 130 typically includes insulating layer 135 (e.g., silicon nitride or $SiN_x$) positioned or deposited thereon, with conductive interconnect layer or structure 136 (e.g., a plurality of conductive members or metal micro-rail interconnect members) positioned between substrate layer 133 and insulating layer 135.

Figures 12A, 12B:
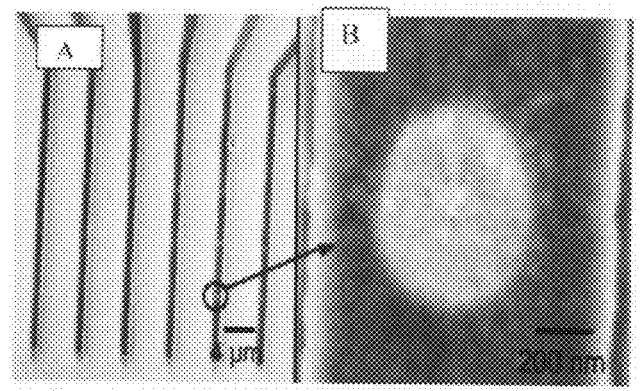
FIG. 12A depicts a scanning electron microscope (SEM) image of about 45 nm windows in silicon nitride exposing metal micro-rails, according to an exemplary embodiment of the present disclosure (scale bar=4 μm)
FIG. 12B depicts an exploded SEM image of electrophoresis deposited metallic SWNTs in one of the windows and on one of the exposed metal micro-rails of FIG. 12A (scale bar=200 nm)

For example, the metal micro-rail interconnect structure or conductive layer 136 may be fabricated on a silicon wafer 133, with a thin insulating layer of silicon nitride 135 being deposited over the micro-rails 136. As shown in FIGS. 11 and 12A, about 45 nm diameter windows or apertures 139 may then be patterned and etched into the silicon nitride or insulating layer 135, with each aperture 139 thereby exposing a top surface of the conductive layers or members 136. A wider range of diameter windows 139 is certainly embraced by this disclosure, e.g., from at least a level of about 150 nm or less as a way to achieve control of the number of nanotubes 134 deposited while still being small enough to accommodate the lithography limitations of level-to-level overlay. FIG. 12A depicts a scanning electron microscope (SEM) image of about 45 nm windows 139 in silicon nitride 135 exposing metal micro-rails 136, according to an exemplary embodiment of the present disclosure (scale bar=4 μm).

In an exemplary embodiment, partially carboxylated SWNTs 134 in an aqueous suspension were then deposited in the windows 139 using electrophoresis, with the metal pattern 136 as the anode and a platinum electrode as the cathode (e.g., using a similar setup as previously discussed in connection with FIG. 2). In one embodiment, the SWNTs 134 were shortened using horn sonification prior to deposition. During the deposition, electrostatic lenses that form around the windows 139 (due to charge buildup on the insulator layer 135) guide the SWNTs (see, e.g., A. Goyal et al., *Journal of Vacuum Science and Technology B*, 26, 2524 (2008)). The first SWNT 134 that deposits on the exposed conductive layer or member 136 makes an electrical connection that modifies the electric field around that window 139 and affects the paths of subsequent SWNTs that approach. For a spatially isolated window 139, there are conditions where a dandelion-like pattern of deposited SWNTs 134 forms in only a few seconds as shown in FIG. 12B. FIG. 12B depicts an exploded SEM image of electrophoresis deposited metallic SWNTs 134 in one of the windows 139 and on one of the exposed metal micro-rails 136 of FIG. 12A (scale bar=200 nm).

In an exemplary embodiment, GOx and Lac were electrochemically attached to deposited SWNTs 134 on alternate micro-rails 136 using in situ cyclic voltammetry to verify the reaction of amino-groups on the enzymes with the —COOH groups on the SWNT walls. The structure was immersed in a solution of glucose that is in the concentration range of normal human blood sugar (about 4 mM) and similar pH about 7. Air was bubbled into the solution to provide oxygen for the reaction.

In an exemplary embodiment and as shown in FIG. 11, a single bio-fuel cell 130 may be formed between adjacent pairs of GOx/SWNT and Lac/SWNT structures 131, 132. In one embodiment, there could be six (6) bio-fuel cells 130 connected in parallel between any appropriate pair of micro-rails 136. An open circuit voltage of 120 mV between pairs of micro-rails 136 was measured, and, taking into account the internal resistance of the voltmeter and the total area of deposited SWNTs 134 on a micro-rail 136, the power density was determined to be in the range of about 0.2 to about 2 mW/cm$^2$, which is higher (by two orders of magnitude) than that reported for a macro-scale direct-electron-transfer enzymatic bio-fuel cell (see, e.g., S. C. Wang et al., *Electrochemistry Communications*, 11, 34 (2009). Without being bound by any theory, it is believed that by optimizing the SWNT/metal contact resistance and by increasing the glucose concentration, this may further increase the output voltage and power density of bio-fuel cell 130.

Exemplary bio-fuel cell architecture 130 is highly scalable. The cell size can be reduced to the limits of lithography and processes used in ICs, and there is control over the number of deposited SWNTs 134, including just one SWNT bundle per window (see FIG. 16, as discussed below). Nano-scaled bio-fuel cells 130 may be located over individual logic elements in an IC (see FIG. 19, as discussed below).

In general, the limited lifetime of the enzymes in certain bio-fuel cells remains an issue for many applications. Laboratory evolution of the enzymes is one avenue to improve their stability (see, e.g., E. T. Farinas, T. Bulter, F. H. Arnold, *Current Opinion in Biotechnology*, 12, 551 (2001)). The open architecture of the bio-fuel cells provided by the present disclosure lends itself to in situ micro-Raman and fluorescence spectroscopy, which may help elucidate the mechanisms for enzyme degradation and suggest other stabilization approaches.

Exemplary Methodology:

The techniques listed below describe an exemplary approach in practicing the systems and methods of the present disclosure. Fabrication of exemplary embodiments of the present disclosure is not limited to these approaches, as they are being provided for illustrative purposes only. Applicant has attempted to disclose embodiments and applications of the disclosed subject matter that could be reasonably foreseen. However, there may be unforeseeable, insubstantial modifications that remain as equivalents. While the present disclosure has been described in conjunction with specific, exemplary embodiments thereof, it is evident that many alterations, modifications, and variations will be apparent to those skilled in the art in light of the foregoing description without departing from the spirit or scope of the present disclosure. Accordingly, the present disclosure is intended to embrace all such alterations, modifications, and variations of the above detailed description.

Bio-Fuel Cell Example:

In general, bio-fuel cells currently suffer from low power densities due to relatively high internal resistance. One source of this resistance is electron transfer between the catalyst (or enzymes) and the internal wires that deliver the electrical power to an outside load. Generally, direct electron transfer ("DET") from the enzyme to the electrode would be the most efficient route. See, e.g., Michael J. Moehlenbrock and Shelley D. Minteer, *Chem. Soc. Rev.*, 37, 1188-1196 (2008). However, effective attachment of the enzyme is important to achieving the unimpeded pathways for the current (J. Lim, N. Cirigliano, J. Wang and B. Dunn, Phys. Chem. Chem. Phys., 9, 1809-1814 (2007)). Another source of resistance is from the mass transport of H$^+$ ions between the anode and cathode. In exemplary embodiments, the present disclosure provides for a way to reduce both sources of internal resistance through the use of well ordered vertical metallic SWNTs (m-SWNTs), thus allowing for an increase in the power density. The m-SWNTs are electrochemically functionalized with glucose oxidase (GOx) and laccase (Lac) to form the anode and cathode respectfully. See, e.g., S. C. Wang, F. Yang, M. Silva, A. Zarow, Y. Wang, and Z. Iqbal, "*Membrane-less and mediator-free enzymatic biofuel cell using carbon nanotube/porous silicon electrodes,*" Electrochemistry Communications 11 (1), 34-37 (2009). By functionalizing the nanotubes, exemplary embodiments of the present disclosure relies on DET between the enzymes and the nanotubes (electrodes), which then conduct the electrons substantially effortlessly through an external load. This resistance is significantly smaller than the mediated transfer of electrons. Since the electron transfer resistance has been reduced the resistance of the H$^+$ ions now dominates the non-reaction kinetics related performance of the fuel cells performance. One method to reduce the H$^+$ resistance is to reduce the distance that the ions have to travel by scaling down the size of the fuel cell. In general, this improvement will be linear when the electrode spacing is larger than the range of Debye screening but dominated by electrode polarization effects (See, e.g., A. K. Manohar, F. Mansfeld, *Electrochemica Acta*, 54, 1664-1670 (2009); and S. Ouitrakul, M. Sriyudthsak, S. Charojrochkul, and T. Kakizono, "*Impedance analysis of bio-fuel cell electrodes,*" Biosensors and Bioelectronics 23 (5), 721-727 (2007)). Within the range of the Debye screening length (about 100 nm) the improvement will be exponential (down to the limit of ohmic resistance). By utilizing advantageous methods of the present disclosure to deposit SWNTs in predefined nano-holes with electrophoresis, it is possible to scale down the electrode distance to about 100 nm or less. See, e.g., A. Goyal, S. Liu, Z. Iqbal, L. A. Fetter, R. C. Farrow, J. Vac. Sci. Technol. B, 26, 2524 (2008). This translates to many orders of magnitude reduction in the H$^+$ ion resistance compared to traditional electrode geometries and can significantly reduce the internal resistance that hinders current bio-fuel cells.

EXAMPLE 1

The substrates for the deposition of carbon nanotubes were 100 mm silicon wafers. Layers of silicon nitride and silicon oxide were deposited using plasma enhanced chemical vapor deposition. Photolithography was used to pattern the micro-rails in OIR620-7i/LOR 3A photoresist with a GCA Autostep stepper. A Cr/Co metal layer (20 nm Cr/200 nm Co) was deposited using an e-beam evaporator. The metal in the unpatterned areas was "lifted-off" by dissolving the resist. An approximately 75 nm thick layer of silicon nitride was then deposited using plasma enhanced chemical vapor deposition (PECVD) followed by evaporation of about 50 nm amorphous carbon and about 5 nm silicon oxide. Six windows or apertures were patterned on each micro-rail using ZEP520A resist and a Jeol 9300FS electron-beam lithography system. Along with the windows on the micro-rails, test patterns were printed on a separate metal pad for diagnostics to help optimize the e-beam lithography and electrophoresis deposition. A reactive ion etch (RIE) was used to open windows in silicon oxide.

Figure 13:
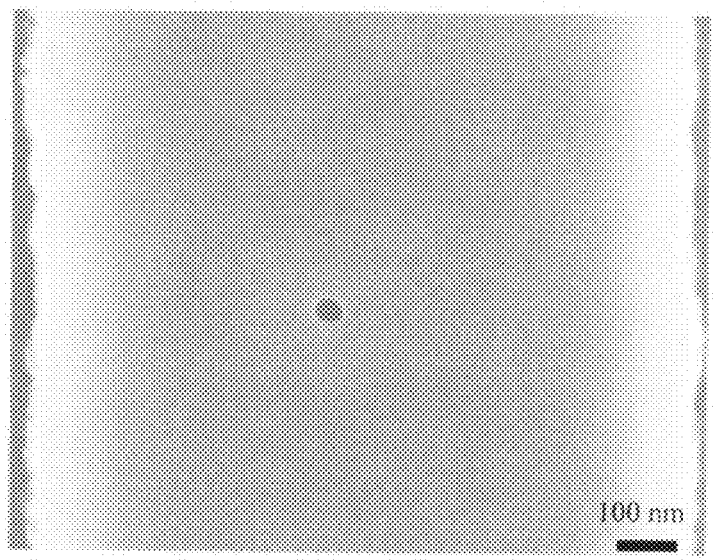
FIG. 13 is an SEM image of about a 45 nm hole or window in silicon nitride on top of about a 1 μm wide Cr/Co micro-rail. The image was taken prior to SWNT deposition, with the carbon etch mask still in place.

Using the silicon oxide as a mask, the window pattern was etched into the carbon with an oxygen plasma. RIE was then used to open windows in the silicon nitride down to the Co metal. A downstream asher was used to remove the carbon layer. A typical result of an isolated window is shown in FIG. 13. FIG. 13 is an SEM image of a about 45 nm hole in silicon nitride on top of a about 1 μm wide Cr/Co micro-rail. The image was taken prior to SWNT deposition, with the carbon etch mask still in place.

Figure 14:
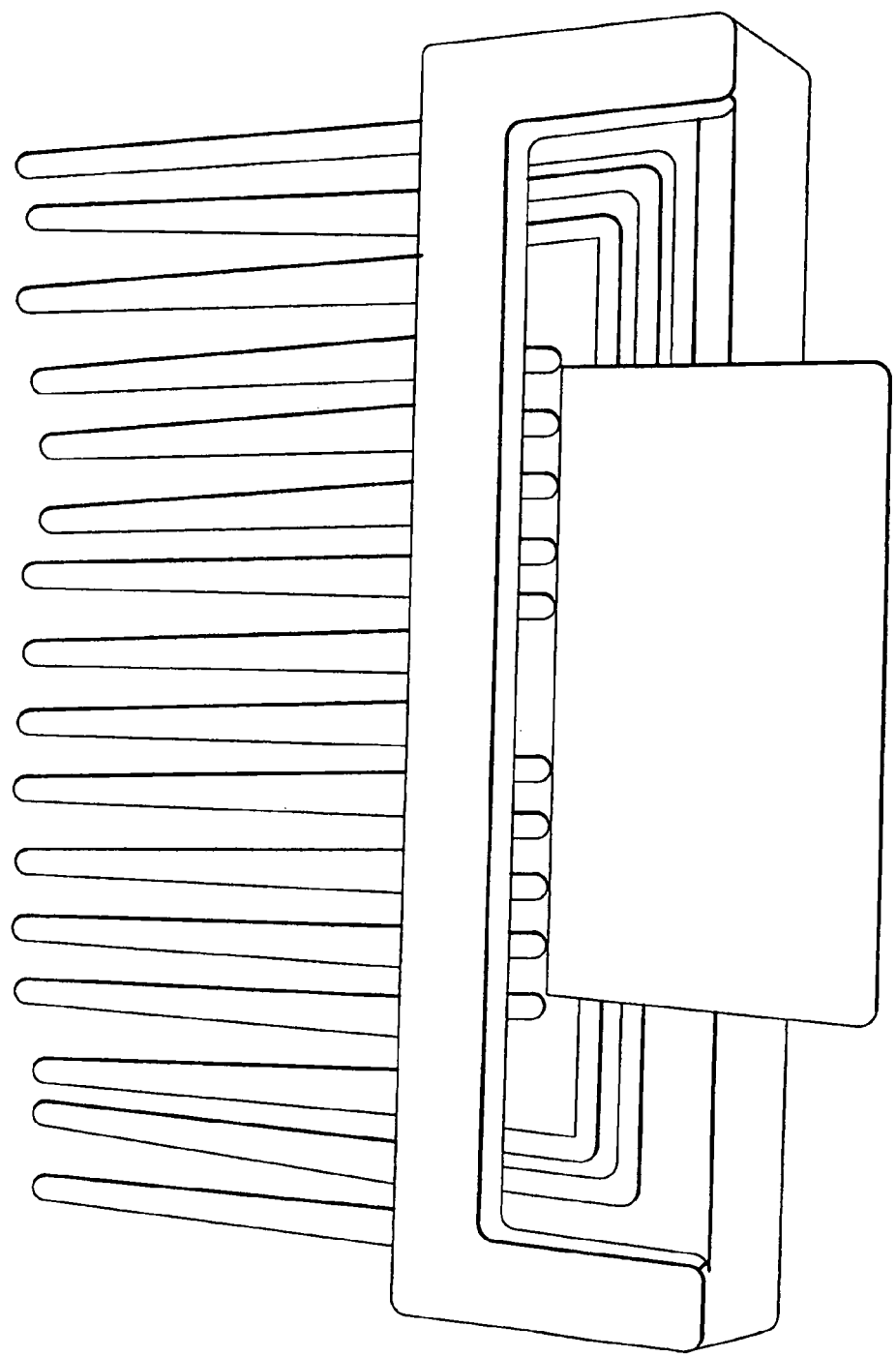
FIG. 14 depicts a test chip for a bio-fuel cell mounted and wire-bonded on a modified ceramic package.

Photolithography and ME were used to remove the silicon nitride layer that was covering contact pads connected to each micro-rail and the wafer was diced into chips. The chips were mounted on a modified ceramic package and the micro-rail contact pads were wire-bonded to contacts on the package as shown in FIG. 14. FIG. 14 depicts a test chip for a bio-fuel cell mounted and wire-bonded on a modified ceramic package.

Metallic single wall carbon nanotubes (SWNTs) were obtained from NanoIntegris Inc. The as-received suspension was >95% metallic SWNTs with a diameter range of about 1.2 to about 1.6 nm. The nanotubes were in an aqueous suspension of about 1 mg/100 ml with a combination of surfactants. For example, the general method for separating the metallic nanotubes (out of a mixture which also includes semiconducting nanotubes) has been reported to include sodium dodecyl sulphate (SDS) and sodium cholate (SC) as surfactants. See, e.g., M. S. Arnold, A. A. Green, J. F. Hulvat, S. I. Stupp, M. C. Hersam, *Nature Nanotechnology* 1, 60 (2006). SDS is an ionic surfactant. The suspension appeared to have no sedimentation of nanotubes. A stable suspension is a prerequisite for electrophoresis of carbon nanotubes (O. O. Van der Biest and L. J. Vandeperre, *Annual Review of Materials Science* 29, 327-352 (1999)).

Figures 15A, 15B, 15C:
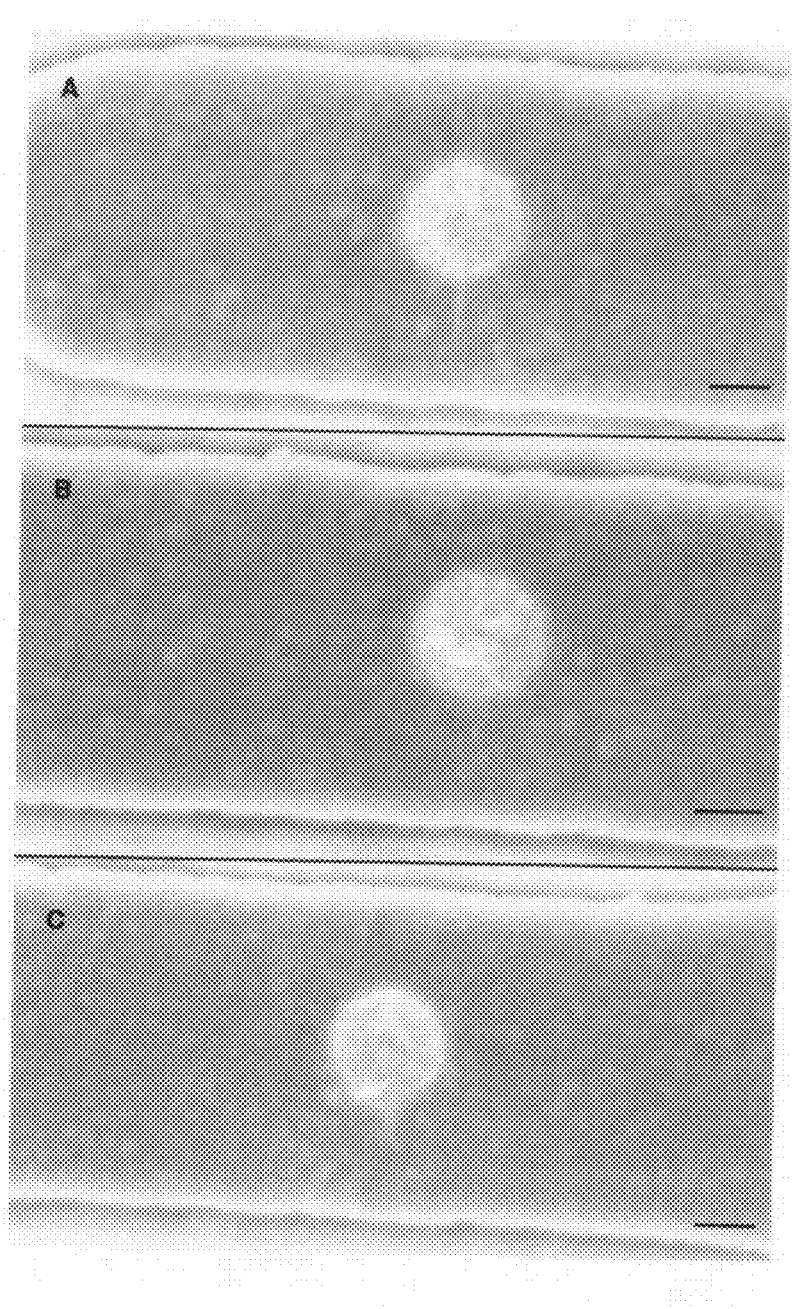
FIGS. 15A-15C illustrate SEM images of electrophoresis deposited metallic SWNTs in about 45 nm windows in silicon nitride on Cr/Co micro-rails.

Several experiments were run to optimize the electrophoretic deposition (EPD) with SWNTs obtained from the supplier. Improved results were obtained with SWNTs that were shortened using a horn sonicator. For the bio-fuel cell experiments a Cole Parmer Ultrasonic Processor with 130 W power was used to sonicate the SWNTs for about 6 hours at about 75% amplitude. Some sedimentation of the SWNTs was observed at the bottom of the beaker after sonication, which would indicate that some of the SWNTs were separated from the surfactant. For the EPD result shown in FIGS. 12A-12B, a 10 V potential was applied for about 5 seconds between the sample (anode) and a platinum electrode (cathode), separated by about 10 mm. Other typical results are shown in FIGS. 15A-15C. FIGS. 15A-15C illustrate SEM images of electrophoresis deposited metallic SWNTs in about 45 nm windows in silicon nitride on Cr/Co micro-rails. The scale bar in each micrograph is 200 nm.

Figure 16:
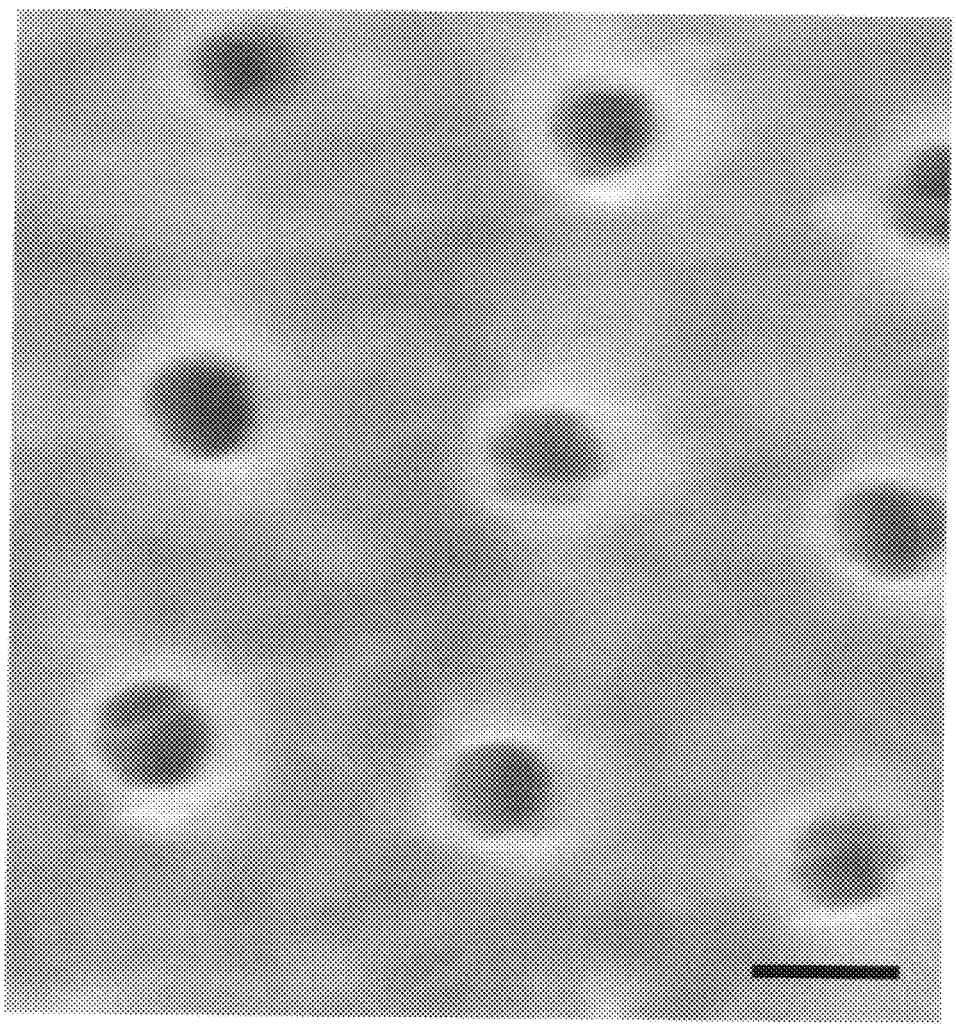
FIG. 16 illustrates an SEM image of semi-conducting SWNTs deposited by electrophoresis in about 60 nm windows in silicon nitride on Cr/Co metal. The spacing between centers is about 260 nm. The scale bar is 100 nm.

As noted above, there are conditions for depositing fewer nanotubes per window. The example shown in FIG. 16 is a typical result for semiconducting nanotubes (from the same supplier) that were deposited on test patterns on chips from the same wafer as the micro-rail patterns. In this example, the EPD deposition was for about 30 seconds. FIG. 16 is an SEM image of semi-conducting SWNTs deposited by electrophoresis in about 60 nm windows in silicon nitride on Cr/Co metal. The spacing between centers is about 260 nm. The scale bar is 100 nm.

It has been found that the number of deposited SWNTs in a window during electrophoresis is a function of, inter alia, the length and diameter of the SWNTs, whether the SWNTs are suspended in bundles or individually, the geometry and spacing of the windows, the concentration of SWNTs in the suspension, and the duration of the deposition. These effects determine how the electric field, Brownian motion, and the viscosity of the fluid influence the paths of the nanotubes. The influence of these parameters on the dynamics of electrophoretic deposition of SWNTs in nano-scaled windows is being studied experimentally and with finite element analysis.

Figure 17:
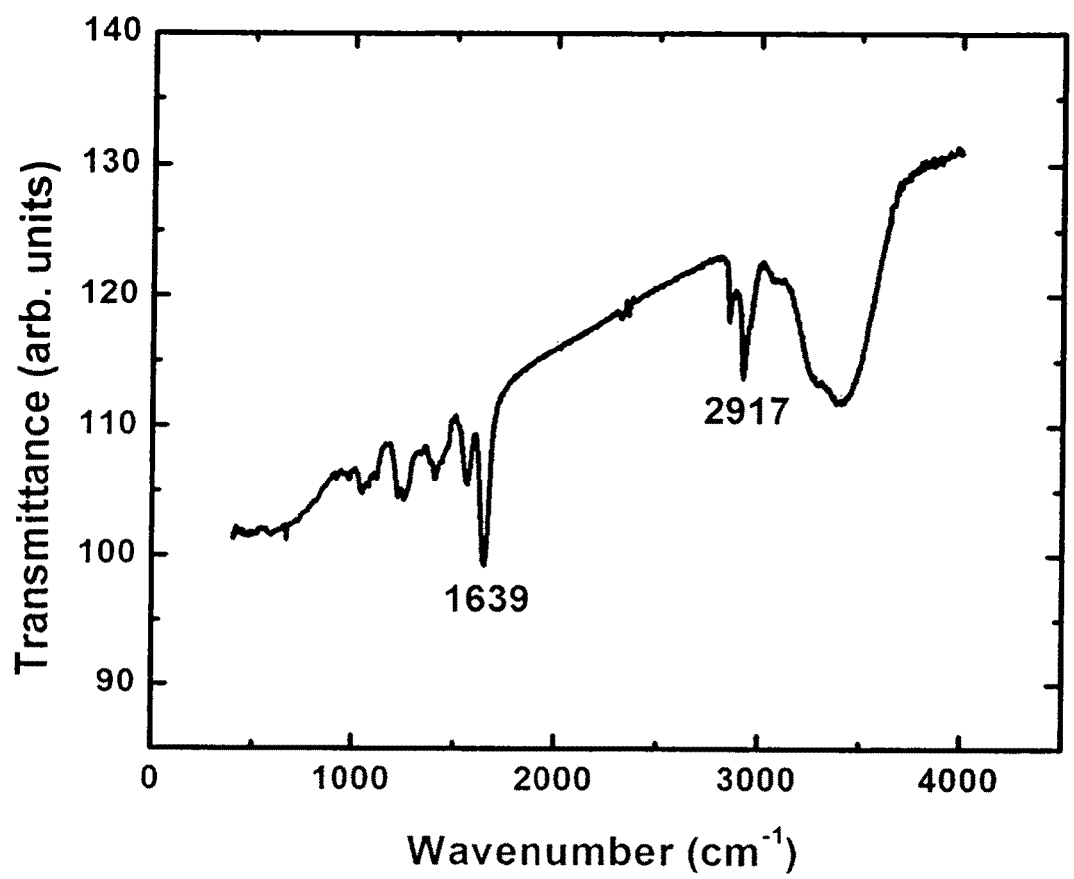
FIG. 17 depicts Fourier Transform Infrared (FT-IR) absorption spectrum of metallic single wall carbon nanotubes dispersed in a KBr pellet. The line at 1639 cm$^{-1}$ can be assigned to —COOH groups on the nanotube sidewalls.

The laccase (Lac) and glucose oxidase (GOx) functionalizations were carried out following the method discussed above (see, e.g., S. C. Wang et al., *Electrochemistry Communications* 11, 34 (2009); S. C. Wang et al, paper presented at the 215th Electrochemical Society Meeting, San Francisco, Calif., 26 May 2009). This involves the attachment of carboxyl groups on the sidewalls of the SWNTs to facilitate covalent bonding of the amino-groups in the enzymes. The as-received SWNTs did not require any acid treatments to functionalize them with carboxyl groups, as their presence was ascertained by Fourier-transform infrared absorption spectroscopy on the as-received sample. The absorption spectrum is shown in FIG. 17. FIG. 17 depicts Fourier Transform Infrared (FT-IR) absorption spectrum of metallic single wall carbon nanotubes dispersed in a KBr pellet. The line at 1639 $cm^{-1}$ can be assigned to —COOH groups on the nanotube sidewalls.

Figures 18A, 18B:
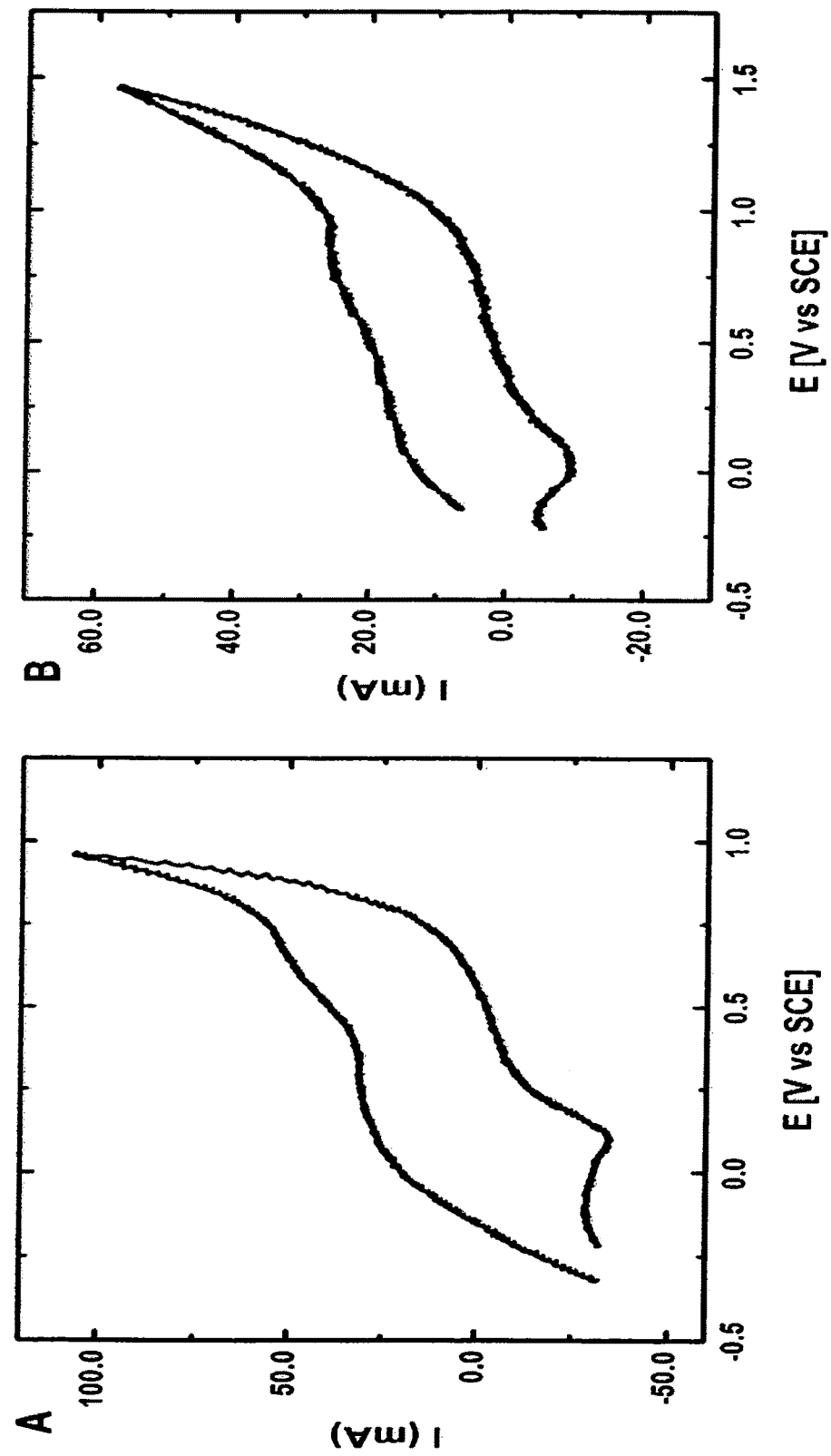
FIGS. 18A-18B depict cyclic voltammograms for: (A) GOx, and (B) Lac functionalization of SWNTs deposited on separate micro-rails.

Enzyme functionalization of a bio-fuel cell anode was performed with an Elchema PS 205B potentiostat/galvanostat system using a three-electrode cell arrangement consisting of one of the micro-rails (with deposited SWNTs) as the working electrode, a Pt counter electrode, and a saturated calomel electrode (SCE) reference electrode, immersed in 1 mg/ml of GOx in about 0.05 M phosphate buffer solution (PBS, pH 7). The functionalization was carried out by sweeping the potential from about −1.5 to about 1.5 V ranging from about 20 to about 200 mV/s scan rate for typically 4-5 cycles. An example of a cyclic voltammogram for the GOx functionalization is shown in FIG. 18A.

After GOx treatment, the sample was rinsed in deionized water. Enzyme functionalization of the cathode was then performed with the same method except in a solution containing 1 mg/ml of Lac in PBS. An example of a cyclic voltammogram for the Lac functionalization is shown in FIG. 18B.

Bio-fuel cell operation was tested by submerging the functionalized SWNT micro-rail structure in a solution of 4 mM of glucose in PBS. Air was bubbled into the solution to provide oxygen. A voltage of about 120 mV between pairs of GOx/Lac functionalized micro-rails was measured using a nanovoltmeter (Keithley Model 181). The manufacturer specified the internal resistance of the nanovoltmeter as $R_1 > 1$ GΩ for this model. It was reported that the internal resistance was in the range of 1 GΩ $< R_1 <$ 10 GΩ for this model. It is believed that this is an important specification, since it sets the lower limit for the power density for a bio-fuel cell that covers such a small area. The area was estimated as the total surface area covered by SWNTs as observed in the SEM. From typical areas shown in FIG. 14, the diameter of deposited SWNTs was about 400 nm. There are six (6) windows per micro-rail which corresponds to a SWNT surface area of about $7.5 \times 10^{-9}$ cm² per micro-rail. This would give a power density ranging from about 0.2 mW/cm² to about 2 mW/cm².

Voltage and Power Optimization:

There are paths for increasing the power density and output voltage. The concentration and pH for these experiments were chosen to simulate the levels found in human blood. To increase the current, the glucose concentration could be increased and the pH lowered. The contact resistance of the SWNT/metal contact contributes to the internal resistance and has not been characterized or optimized for this architecture. It may be reduced with a different choice of metal and/or annealing. As an example, SWNTs have been successfully deposited on Cu using electrophoresis. Low resistance contacts between SWNTs and Au using dielectrophoretic deposition have been demonstrated (see, e.g., P. Makaram et al., Nanotechnology 18, 395204 (2007)). There are at least three key interface/materials conditions that will impact the ability to fabricate low resistance contacts at the ends of metallic SWNTs: 1) the work function difference between the metal and the SWNT, 2) the tendency of the metal to form an oxide (not desired), and 3) the tendency of the metal to form a carbide (desired). See, e.g., T. Bing-Yue, W. Chien-Li, C. Chih-Lien et al., 2006 *International Symposium on VLSI Technology, Systems, and Applications*, (2006) [extended abstract online: http://ieeexplore.ieee.org/stamp/stamp.jsp?arnumber=4016614&isnumber=4016579]; and W. P. Leroy, C. Detavernier, R. L. Van Meirhaeghe, C. Lavoie, *Journal of Applied Physics* 101, 053714 (2007).

Also, in the experiments reported here, there is a network of SWNTs around each window (FIGS. 15A-15C), and only a few (possibly just one) are connected directly to the metal contact. The path of some charges generated at GOx and Lac may travel through one or more other SWCNTs en route to the metal contact. The contact resistance between overlapping SWNTs is a component in the internal resistance of the bio-fuel cell. The internal resistance would be optimal if the number of SWNTs deposited is limited to those that make contact with the metal.

Figure 19:
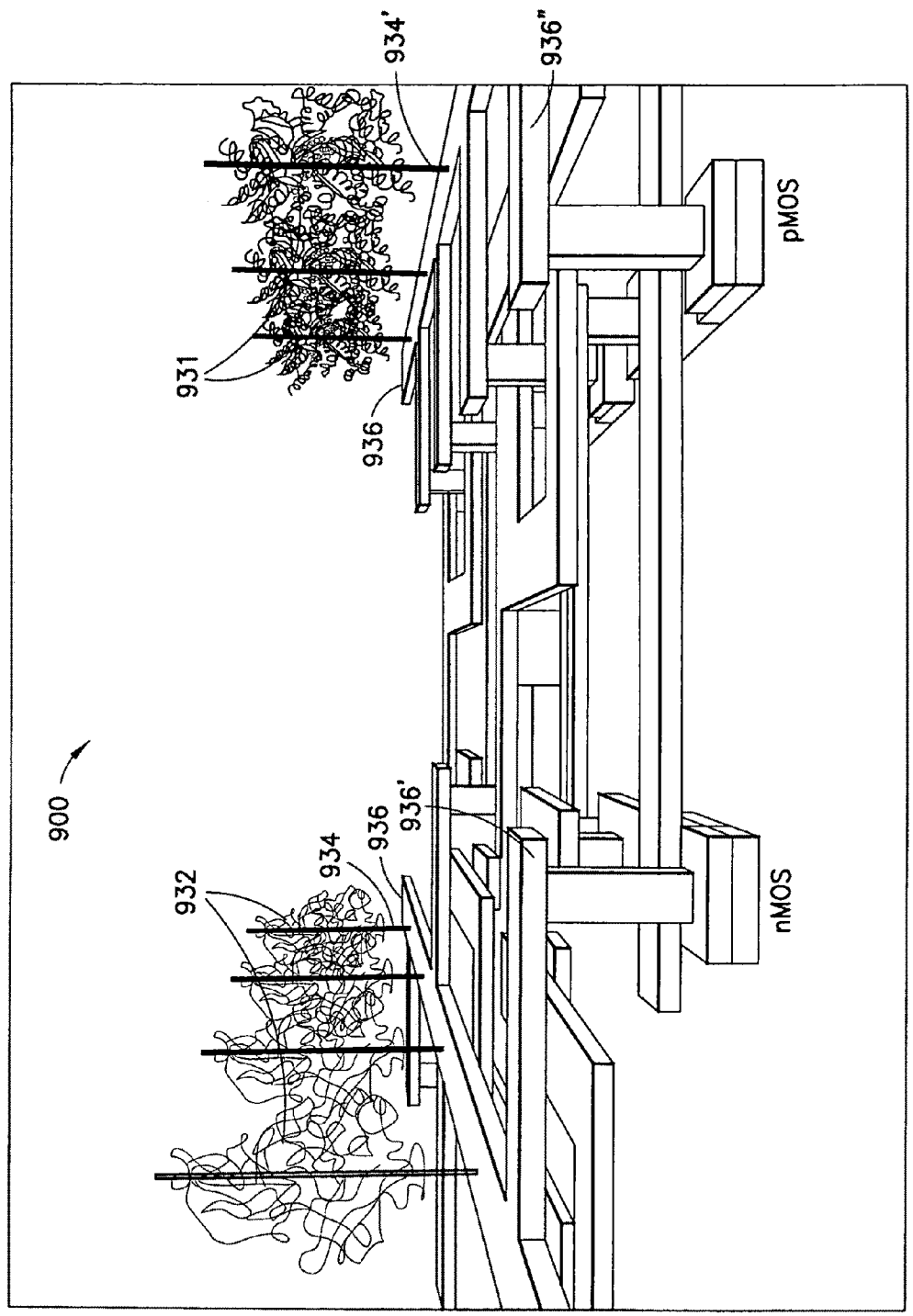
FIG. 19 is a schematic representation of localized bio-fuel cell power for a latch circuit in a complementary metal oxide semiconductor integrated circuit. The Lac enzymes are connected/attached (by way of SWNTs) to the negative supply (ground), $V_{SS}$, for the nMOS circuit and the GOx enzymes are connected/attached (by way of SWNTs) to the positive supply, $V_{DD}$, for the pMOS circuit.

Highly Localized Power for Integrated Circuits:

The open architecture of the exemplary bio-fuel cell reported here lends itself to scaling down to the limits of process technology for nanofabrication. This would allow for nano-bio-fuel cells to power individual logic elements in an integrated circuit (IC). For example, this could be achieved by modifying the IC design to include windows down to each logic element where the supply voltage and ground are normally routed (e.g., $V_{DD}$ for pMOS and $V_{SS}$ for nMOS). In such a configuration, each anode would be paired with its nearest neighboring cathode to supply power locally. The concept is shown schematically for a simple latch circuit 900 in FIG. 19. More particularly, FIG. 19 is a schematic representation of localized bio-fuel cell power for a latch circuit 900 in a complementary metal oxide semiconductor integrated circuit. The Lac enzymes of cathodes 932 are connected (by way of functionalization with SWNTs 934) to the negative supply (ground) 936', $V_{SS}$, for a nMOS circuit, and the GOx enzymes of anodes 931 are connected/attached (by way of functionalization with SWNTs 934') to the positive supply 936", $V_{DD}$, for a pMOS circuit. Exemplary circuit 900 also includes conductive members 936.

As shown in FIG. 19, the bio-fuel cells would be connected in parallel along $V_{DD}$ and $V_{SS}$ nano-rails 936, such that variations in power requirements could be shared locally. This would require a minimal change in the IC architecture since the $V_{DD}/V_{SS}$ routing design tools are mature. The localized power could eliminate the ohmic losses from routing power from the edge of the IC. For this IC application to be successful, the output voltage of this nano-biofuel cell most likely would need to approach its electrochemical limit (e.g., 1 V) to gate field effect transistors. Connecting bio-fuel cells in series on the same plane (e.g., to increase the voltage) would require a strategy to keep the fluid electrolyte from inappropriately shorting the connections between cells. This isolation could be achieved with additional microfluidics.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A bio-fuel cell comprising:
   a substrate having positioned thereon a first conductive member and a second conductive member with an insulating layer positioned over the substrate and the first and second conductive members, the insulating layer: (i) having a first aperture formed therein exposing a first region of the first conductive member, with an electrophoretically deposited first nanotube having a first end in contact with the exposed first region of the first conductive member, and (ii) having a second aperture formed therein exposing a second region of the second conductive member, with an electrophoretically deposited second nanotube having a first end in contact with the exposed second region of the second conductive member;
   the first nanotube electrically coupled to the second nanotube, the first nanotube configured to be a cathode and the second nanotube configured to be an anode; and
   an electrolyte in electrical communication with the cathode and the anode;
   wherein the cathode and anode are configured to provide electrical power to an electrical device, and the electrical device is a complementary metal oxide semiconductor integrated circuit;
   wherein the cathode is connected to a negative supply for a nMOS circuit and the anode is connected to a positive supply for a pMOS circuit;
   wherein the anode and the cathode are configured and dimensioned to locally supply power to the complementary metal oxide semiconductor integrated circuit; and
   wherein the locally supplied power substantially eliminates the ohmic losses from routing power from the complementary metal oxide semiconductor integrated circuit.

2. The bio-fuel cell of claim 1, wherein the insulating layer is configured to generate an electric field around the first and second apertures;

wherein the first and second apertures are each sized to allow a plurality of nanotubes to contact the exposed first and second regions of the first and second conductive members; and wherein after the first and second nanotubes are electrophoretically deposited, the deposited first and second nanotubes are each adapted to reconfigure the electric field to thereby prevent other nanotubes from the plurality of nanotubes from being deposited on the exposed first and second regions of the first and second conductive layers.

3. The bio-fuel cell of claim 1, wherein the first and second apertures each have a diameter of at least about 40 nm.

4. The bio-fuel cell of claim 1, wherein a top surface of the substrate defines a horizontal plane; and wherein the first and second conductive members are both positioned on the horizontal plane of the substrate.

5. The bio-fuel cell of claim 4, wherein the deposited first and second nanotubes are oriented substantially perpendicular with respect to the horizontal plane.

6. The bio-fuel cell of claim 1, wherein the bio-fuel cell does not require a proton exchange membrane or mediator molecules to transfer charges to the anode and cathode.

7. The bio-fuel cell of claim 1, wherein the complementary metal oxide semiconductor integrated circuit is positioned at least in part on the substrate.

8. The bio-fuel cell of claim 7, wherein the cathode and anode are integrated with the complementary metal oxide semiconductor integrated circuit.

9. The bio-fuel cell of claim 1, wherein the substrate is silicon.

10. The bio-fuel cell of claim 1, wherein the first and second nanotubes are partially carboxylated nanotubes.

11. The bio-fuel cell of claim 1, wherein the cathode is functionalized with a first enzyme after deposition; and
wherein the anode is functionalized with a second enzyme after deposition.

12. The bio-fuel cell of claim 11, wherein the first enzyme is laccase and the second enzyme is glucose oxide.

13. The bio-fuel cell of claim 1 further comprising:
an electrophoretically deposited third nanotube having a first end in contact with the exposed first region of the first conductive member;
an electrophoretically deposited fourth nanotube having a first end in contact with the exposed second region of the second conductive member;
the first and third nanotubes configured to be the cathode and the second and fourth nanotubes configured to be the anode.

14. The bio-fuel cell of claim 1 further comprising:
a first network of a first plurality of nanotubes associated with the first nanotube and a second network of a second plurality of nanotubes associated with the second nanotube;
the first nanotube and the first network configured to be the cathode and the second nanotube and the second network configured to be the anode.

15. A method of fabricating a bio-fuel cell comprising:
providing a substrate having positioned thereon a first conductive member and a second conductive member with an insulating layer positioned over the substrate and the first and second conductive members;
forming a first aperture in the insulating layer to expose a first region of the first conductive member;
forming a second aperture in the insulating layer to expose a second region of the second conductive member;
generating an electric field proximate to the first and second apertures, the electric field configured to direct a plurality of nanotubes towards the first and second exposed regions of the first and second conductive members;
depositing a first nanotube on the first exposed region of the first conductive member and a second nanotube on the second exposed region of the second conductive member by electrophoresis, the deposited first nanotube having one end contacting the first exposed region of the first conductive member and the deposited second nanotube having one end contacting the second exposed region of the second conductive member;
configuring the first nanotube to be a cathode and the second nanotube to be an anode;
electrically coupling the cathode to the anode;
providing an electrolyte in electrical communication with the cathode and anode;
configuring the cathode and anode to provide electrical power to an electrical device, and the electrical device is a complementary metal oxide semiconductor integrated circuit;
connecting the cathode to a negative supply for a nMOS circuit and connecting the anode to a positive supply for a pMOS circuit; and
configuring the anode and the cathode to locally supply power to the complementary metal oxide semiconductor integrated circuit, the locally supplied power substantially eliminating the ohmic losses from routing power from the complementary metal oxide semiconductor integrated circuit.

16. The method of claim 15, wherein the first and second apertures are each sized to allow a plurality of nanotubes to contact the exposed first and second regions of the first and second conductive members; and
wherein after the first and second nanotubes are deposited, the deposited first and second nanotubes are each adapted to reconfigure the electric field to thereby prevent other nanotubes from the plurality of nanotubes from being deposited on the exposed first and second regions of the first and second conductive layers.

17. The method of claim 15, wherein the first and second apertures each have a diameter of at least about 40 nm.

18. The method of claim 15, wherein a top surface of the substrate defines a horizontal plane; and
wherein the first and second conductive members are both positioned on the horizontal plane of the substrate.

19. The method of claim 18, wherein the deposited first and second nanotubes are oriented substantially perpendicular with respect to the horizontal plane.

20. The method of claim 15, wherein the fabricated bio-fuel cell does not require a proton exchange membrane or mediator molecules to transfer charges to the anode and cathode.

21. The method of claim 15 further comprising positioning the electrical device at least in part on the substrate.

22. The method of claim 21 further comprising integrating the cathode and anode with the electrical device.

23. The method of claim 15, wherein the substrate is silicon.

24. The method of claim 15, wherein the first and second nanotubes are partially carboxylated nanotubes.

25. The method of claim 15, wherein the configuring the first nanotube to be the cathode step includes functionalizing the first nanotube with a first enzyme after deposition of the first nanotube; and wherein the configuring the second nanotube to be the anode step includes functionalizing the second nanotube with a second enzyme after deposition of the second nanotube.

26. The method of claim 25, wherein the first enzyme is laccase and the second enzyme is glucose oxide.

27. The method of claim 15 further comprising:
associating a first network of a first plurality of nanotubes with the first deposited nanotube and associating a second network of a second plurality of nanotubes with the second nanotube;
configuring the first nanotube and the first network to be the cathode and configuring the second nanotube and the second network to be the anode.

28. A method of fabricating a bio-fuel cell comprising:
providing a substrate having positioned thereon a first conductive member and a second conductive member with an insulating layer positioned over the substrate and the first and second conductive members;
forming a first elongated aperture in the insulating layer to expose a first region of the first conductive member, the first elongated aperture having a first width and a first length larger than the first width;
forming a second elongated aperture in the insulating layer to expose a second region of the second conductive member, the second elongated aperture having a second width and a second length larger than the second width;
generating an electric field proximate to the first and second apertures, the electric field configured to direct a first plurality of nanotubes towards the first and second exposed regions of the first and second conductive members;
depositing: (i) a second plurality of nanotubes in a first line pattern on the first exposed region of the first conductive member, and (ii) a third plurality of nanotubes in a second line pattern on the second exposed region of the second conductive member, by electrophoresis;
configuring the second plurality of nanotubes to be a cathode and configuring the third plurality of nanotubes to be an anode;
electrically coupling the cathode to the anode;
providing an electrolyte in electrical communication with the cathode and anode;
configuring the cathode and anode to provide electrical power to an electrical device, and the electrical device is a complementary metal oxide semiconductor integrated circuit;
connecting the cathode to a negative supply for a plurality of nMOS circuits and connecting the anode to a positive supply for a plurality of pMOS circuits;
configuring the anode and the cathode to locally supply power to the complementary metal oxide semiconductor integrated circuit, the locally supplied power substantially eliminating the ohmic losses from routing power from the complementary metal oxide semiconductor integrated circuit;
wherein the width of the first aperture is sufficiently small to restrict deposition of the second plurality of nanotubes to the first line pattern and the number of nanotubes in the second plurality is determined at least in part by the length of the aperture;
wherein the width of the second aperture is sufficiently small to restrict deposition of the third plurality of nanotubes to the second line pattern and the number of nanotubes in the second plurality is determined at least in part by the length of the aperture;
wherein the number of nanotubes in the first plurality of nanotubes is greater than the number of nanotubes in the second plurality of nanotubes, and wherein the number of nanotubes in the first plurality of nanotubes is greater than the number of nanotubes in the third plurality of nanotubes.

29. The method of claim 28, wherein after the second and third plurality of nanotubes are deposited, the deposited second and third plurality of nanotubes each re-configure the electric field to thereby prevent other nanotubes from the first plurality of nanotubes from being deposited on the first and second exposed regions of the first and second conductive members.

* * * * *